(12) United States Patent
Teh

(10) Patent No.: US 9,819,345 B2
(45) Date of Patent: Nov. 14, 2017

(54) SCALABLE 2.5D INTERFACE ARCHITECTURE

(71) Applicant: Altera Corporation, San Jose, CA (US)

(72) Inventor: Chee Hak Teh, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 259 days.

(21) Appl. No.: 14/692,133

(22) Filed: Apr. 21, 2015

(65) Prior Publication Data
US 2016/0098061 A1 Apr. 7, 2016

Related U.S. Application Data

(60) Provisional application No. 62/058,933, filed on Oct. 2, 2014.

(51) Int. Cl.
*H03K 19/0185* (2006.01)
*G06F 17/50* (2006.01)

(52) U.S. Cl.
CPC ... *H03K 19/01855* (2013.01); *G06F 17/5068* (2013.01)

(58) Field of Classification Search
CPC .......... H03K 19/01855; G06F 17/5068; G06F 13/5068
See application file for complete search history.

(56) References Cited

U.S. PATENT DOCUMENTS

| | | | | |
|---|---|---|---|---|
| 8,664,975 B1* | 3/2014 | Gao | ................... | G06F 17/5054 326/38 |
| 2002/0060595 A1* | 5/2002 | Nakano | ................... | G06F 1/10 327/295 |
| 2012/0124257 A1* | 5/2012 | Wu | ................... | H01L 25/18 710/106 |
| 2014/0281204 A1* | 9/2014 | Jeddeloh | ................ | G11O 5/066 711/106 |

* cited by examiner

*Primary Examiner* — Farley Abad
(74) *Attorney, Agent, or Firm* — Fletcher Yoder, P.C.

(57) ABSTRACT

Systems and methods for interface block. The interface block includes input/output modules distributed along the interface block and a mid-stack module interspersed within the input/output modules. The input/output modules include at least one data module and at least one command module. At least one of the input/output modules is shared by an adjacent pair of channels. Each of the input/output modules is configured to interface with a memory device via a silicon interposer or equivalent. The mid-stack module is in communication with the input/output modules via programmable logic circuitry. The mid-stack module may include independent clock quadrants. Each clock quadrant is configured to operate at different phases where each phase is aligned to a respective core clock.

17 Claims, 33 Drawing Sheets

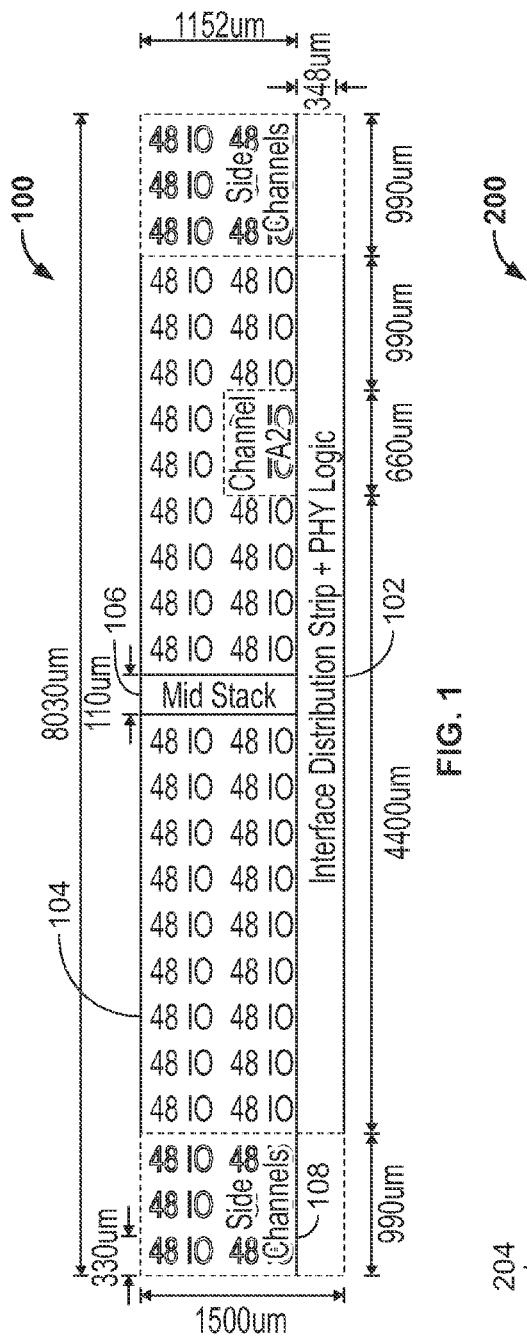

| | | |
|---|---|---|
| | Unused 48-IO Modules | |
| ChE DWORD0 | ChA DWORD0 | |
| ChF DWORD0 | ChB DWORD0 | |
| ChE DWORD1 | ChA DWORD1 | |
| ChF DWORD1 | ChB DWORD1 | |
| ChE AWORD | ChA AWORD | |
| ChF AWORD | ChB AWORD | |
| ChE DWORD2 | ChA DWORD2 | Interface Distribution Strip + PHY Logic |
| ChF DWORD2 | ChB DWORD2 | |
| ChE DWORD3 | ChA DWORD3 | |
| ChF DWORD3 | ChB DWORD3 | |
| Mid Stack (RESET_n, SECT) | | |
| ChG DWORD0 | ChC DWORD0 | |
| ChH DWORD0 | ChD DWORD0 | |
| ChG DWORD1 | ChC DWORD1 | |
| ChH DWORD1 | ChD DWORD1 | |
| ChG AWORD | ChC AWORD | |
| ChH AWORD | ChD AWORD | |
| ChG DWORD2 | ChC DWORD2 | |
| ChH DWORD2 | ChD DWORD2 | |
| ChG DWORD3 | ChC DWORD3 | |
| ChH DWORD3 | ChD DWORD3 | |
| | Unused 48-IO Modules | |

FIG. 3

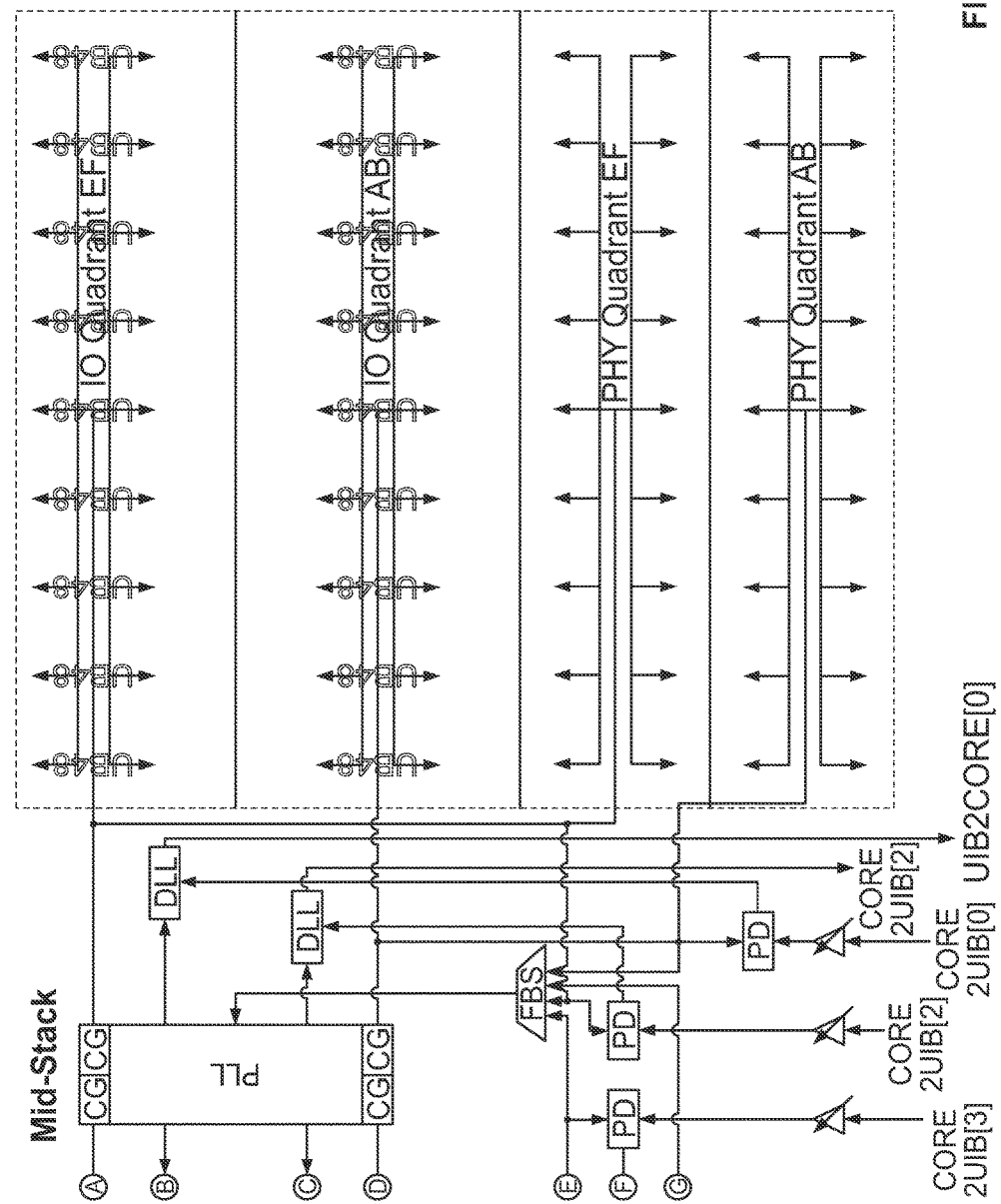

SCALABLE 2.5D INTERFACE ARCHITECTURE

CROSS REFERENCE TO RELATED APPLICATIONS

This claims the benefit of copending, commonly-assigned U.S. Provisional Patent Application No. 62/058,933, filed on Oct. 2, 2014, which is hereby expressly incorporated by reference in its entirety.

FIELD OF THE INVENTION

This disclosure relates generally to the area of system interconnect architectures for establishing communication between multiple memory devices.

BACKGROUND OF THE INVENTION

The semiconductor industry is gradually moving towards 2.5D and 3D architectures to address silicon scalability. The 2.5D configuration refers to connecting two or more silicon dice via a silicon interposer or equivalent on the same package. The various silicon dice are typically connected via small bumps referred to as micro-bumps. The 2.5D interface architectures are new in the industry but are gaining momentum and support from many application-specific integrated circuit (ASIC), application specific standard product (ASSP), and field-programmable gate array (FPGA) developers, especially in applications for interfacing to memory devices targeted to address latency and bandwidth concerns. However, current 2.5D architectures are capable of interfacing only to a single 2.5D device and are not targeted as scalable interfaces for generic 2.5D devices.

SUMMARY OF THE INVENTION

This invention relates to the architecture of a scalable 2.5D interface, specifically the partitioning of the input/output (I/O) buffers, controls as well as functions across the entire architecture that allows the same interface block to communicate with a myriad of 2.5D memory devices as well as other integrated circuit devices (e.g., ASIC, ASSP, and FPGA) with similar 2.5D interface via a silicon interposer or bridge.

This interface architecture extends the usefulness of the interface beyond just interfacing to 2.5D memory devices. The disclosure includes definition of a small programmable I/O module that can be duplicated to match the width of the 2.5D interface, partitioning of the interface I/O buffers and effective grouping of its control to allow maximum flexibility to interface to varying protocol standards. The net resulting architecture allows for a single hardware structure to interface with a myriad of memory devices simply by coupling it with the right soft logic counterpart implemented with programmable logic fabric, such as FPGA fabric. Extensions of the architecture also allow for the same hardware structure to scale to interface with external ASIC, ASSP or other silicon dice to address many other application-domain problems without having to refabricate hardware for the interface architecture.

Existing 2.5D interface architectures are typically developed for interfacing to a proprietary static random-access memory (SRAM) die via a proprietary 2.5D interface protocol. The interface architecture adapts double-data-rate (DDR) signaling synchronous to the clock driven by the host via a simple I/O interface. Synchronous DDR signaling of the interface architecture may limit the maximum frequency achievable by the architecture as latency introduced by interconnect propagation can reduce the available sampling window on the interface. In some embodiments, the synchronous DDR architecture is barely able to achieve 500 MHz operation while realistic operation is likely at an even lower frequency. Moreover, the interface architecture may only provide for interfacing to proprietary SRAM memory dice. The interface is not scalable to industry-developed communication protocols, thus locking the choice of available daughter devices to interface to the proprietary option.

The partitioning of various 2.5D interface architectures may also be rigid and disallow configurability for support of various emerging 2.5D interface standards. For example, Quad Data Rate Wide Input Output (QDR WIO) SRAM is an electrical superset but protocol subset of High-Bandwidth Memory (HBM) DRAM. Existing industry 2.5D interface architectures are not partitioned to adapt to these different standards and may not allow the same ASIC/ASSP silicon to interface to different memory devices.

Accordingly, systems and methods relating to the architecture of a scalable 2.5D interface are described. In some aspects, the disclosed interface architecture includes an interface block. Input/output modules are distributed along the interface block. A mid-stack module is interspersed within the plurality of input/output modules. The input/output modules include at least one data module and at least one command module. At least one of the input/output modules is shared by an adjacent pair of channels. Each of the input/output modules is configured to interface with a memory device via a silicon interposer, a silicon bridge, or equivalent. Each of the input/output modules may include a 48-I/O module. The mid-stack module is in communication with the input/output modules via programmable logic circuitry.

In some embodiments, the mid-stack includes independent clock quadrants. Each clock quadrant is configured to operate at different phases. In some embodiments, each phase is aligned to a respective core clock. In some embodiments, each respective core clock is aligned to a physical layer clock.

In some embodiments, each of the input/output modules includes a first set of pins mapped to one of a set of programmable single-ended input/output (PSIO) sub-modules and a second set of pins mapped to one of a set of programmable differential/single-ended input/output (PDIO) sub-modules. A clock topology may be provided that is partitioned such that a first set of clocks are redistributable from a first half of the PSIO sub-modules to a second half of the PSIO sub-modules.

In some embodiments, at least one of the input/output modules shared by the adjacent pair of channels is partitioned into two sub-modules with the same number of pins.

In some embodiments, the data module of the input/output modules includes a first subset of PDIO sub-modules mapped to output strobe pins and a second subset of PDIO sub-modules mapped to input strobe pins. The command module of the input/output modules may include a differential clock output mapped to a PDIO sub-module.

In some embodiments, at least one data module further includes a first loop circuit mapped to the first subset of PDIO sub-modules and a second loop circuit mapped to the second subset of PDIO sub-modules. The first loop circuit is configured to delay an output strobe unit mapped to a PSIO group. The first loop circuit and the second loop circuit may include a delay-locked loop (DLL) circuit or a phase-locked loop (PLL) circuit.

In some embodiments, each input/output module communicates with the programmable logic circuitry via a universal interface protocol including a control interface group and/or a data interface group. The control interface group transmits an address, a command, and/or a control signal to the programmable logic circuitry. The data interface group transmits to and receives data from the programmable logic circuitry.

In some aspects, the systems and methods described herein include a method relating to an architecture of a scalable 2.5D interface to execute the functionality described above.

It should be noted, the systems and/or methods described above may be applied to, or used in accordance with, other systems, methods and/or apparatuses.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 1 is an illustrative interface block according to certain embodiments;

FIG. 2 is an illustrative interface block including 48-IO modules for interfacing with a 32-Channel QDR WIO SRAM according to certain embodiments;

FIG. 3 is an illustrative interface block including 48-IO modules for interfacing with an 8-Channel HBM DRAM according to certain embodiments;

FIGS. 9A and 9B (hereinafter collectively referred to as FIG. 9) depicts another illustrative clock network topology for an interface block according to certain embodiments;

DETAILED DESCRIPTION

Figure 4:
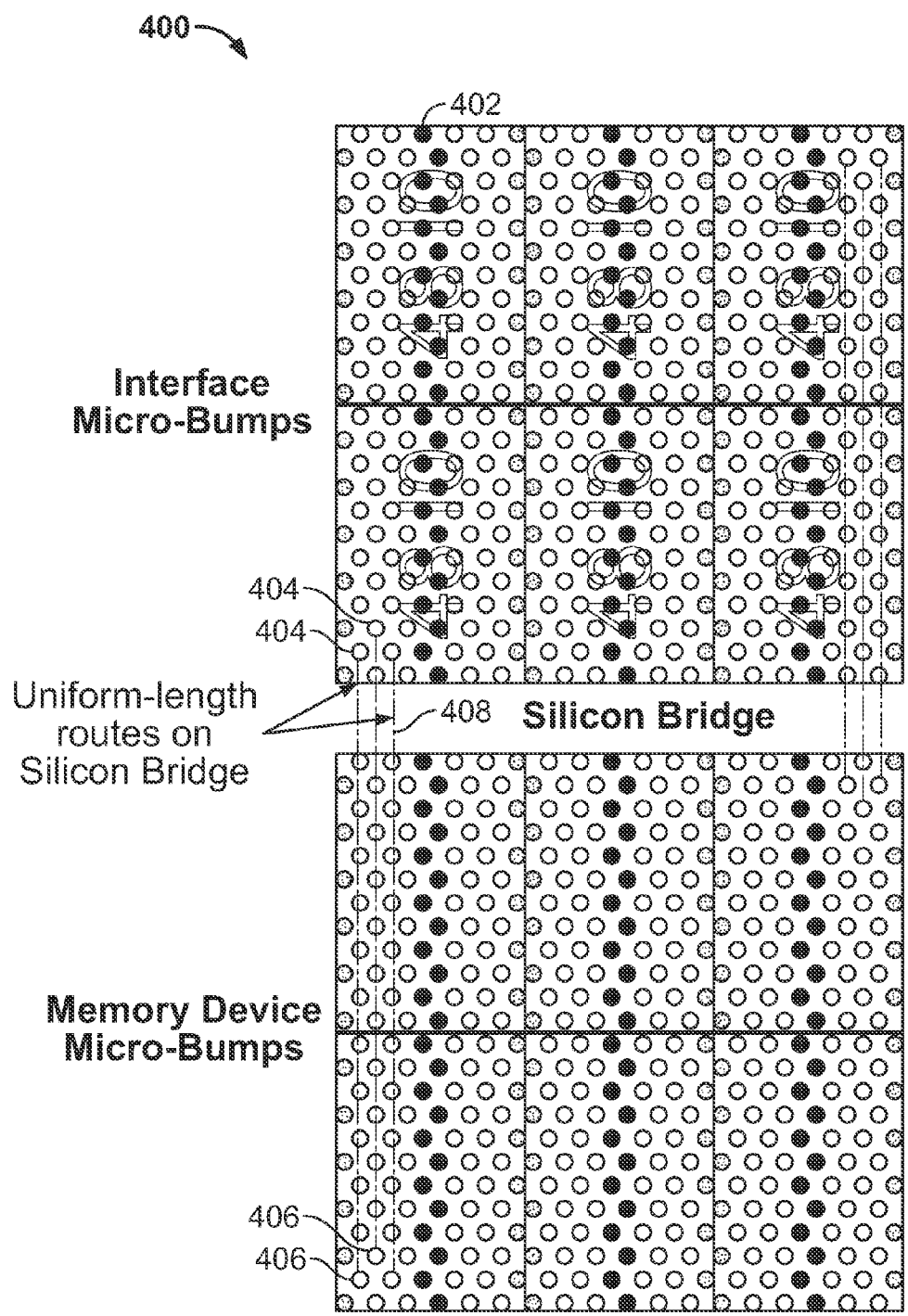
FIG. 4 is an illustrative depiction of connecting 48-IO modules to respective memory interfaces according to certain embodiments.

This disclosure describes a 2.5D interface architecture. Although the context of the description is primarily using the disclosed interface block as a 2.5D memory architecture solution (e.g., supporting both QDR WIO SRAM and HBM DRAM), nothing restricts the disclosed interface block from supporting any 2.5D interface that is either on the main die or the daughter die in any 2.5D configuration as long as the interface is source-synchronous in nature.

FIG. 1 is an illustrative interface block according to certain embodiments. Interface block 100 is organized in a modular manner and includes a collection of 48-IO modules 104 (including side channels 108) and a middle odd module known as the mid-stack module 106. Distribution strip and physical layer (PHY) logic area 102 includes synthesizable control logic required for I/O calibration and staging. Each 48-IO module 104 can be configured as either a data or command module. A command module may only occupy half the 48-IO module such that adjacent channels may physically share a 48-IO module. This may allow for better pin utilization as well as matching the micro-bump organization of the memory interface standards. A combination of more than one 48-IO module is required to form an interface to QDR WIO SRAM, HBM DRAM, or another suitable memory device. FIGS. 2 and 3 provide illustrative examples of forming such an interface. The dimensions shown are illustrative and not limiting as to the dimensions of interface block 100. The illustrative embodiment in FIG. 1 utilizes a 48-IO module but the disclosure is not so limited. The illustrative embodiments of the subsequent drawings utilizing 48-IO modules are also not so limited. The illustrative embodiments may instead utilize another appropriate type of module. A 48-IO module is a block capable of providing dual source bi-directional source-synchronous signaling capabilities. An exemplary 48-IO module includes two PSIO groups with 20 PSIO buffers each, four PDIOs, two DLLs, and pointer generators.

FIG. 2 shows an illustrative interface block for interfacing with a 32-Channel QDR WIO SRAM according to certain embodiments. Interface block 200 is organized in a modular manner and includes a collection of 48-IO modules 204 and mid-stack module 206. Interface block 200 shows how the various 48-IO modules map to form the memory interface for the 32-Channel QDR WIO SRAM.

FIG. 3 shows an illustrative interface block for interfacing with an 8-Channel HBM DRAM according to certain embodiments. Interface block 300 is also organized in a modular manner and includes a collection of 48-IO modules 304 and mid-stack module 306. Interface block 300 also includes a set of unused 48-IO modules 308 that are not needed for interfacing with the 8-Channel HBM DRAM. Interface block 300 shows how the various 48-IO modules map to form the memory interface for the 8-Channel HBM DRAM.

Table 1 below details the various module requirements for different memory channel configurations. For example, interface block 200 needs 16 modules configured as command modules and 32 modules configured as data modules to interface with the 32-Channel QDR WIO SRAM. In another example, interface block 200 needs 12 modules configured as command modules and 24 modules configured as data modules to interface with a 24-Channel QDR WIO SRAM. In yet another example, interface block 300 needs only 4 modules configured as command modules and 32 modules configured as data modules to interface with an 8-Channel HBM DRAM.

TABLE 1

Example Mappings for Memory Channel Configurations

| Standard | Channel Configuration | #CMD 48-IO | #DATA 48-IO | Pins Used | Unused | Total | Efficiency |
|---|---|---|---|---|---|---|---|
| QDR WIO | 32-Channels (16 RW + 16 RO) | 16 | 32 | 2026 | 326 | 2352 | 86.14% |
| | 24-Channels (12 RW + 12 RO) | 12 | 24 | 1522 | 206 | 1728 | 88.08% |
| HBM | 8-Channels | 4 | 32 | 1639 | 89 | 1728 | 94.85% |

FIG. 4 is an illustrative depiction 400 of mapping 48-IO modules to respective memory interfaces according to certain embodiments. The mapping of the various 48-IO modules 402 to the respective memory interfaces generally favors uniform length routing across the interface as shown. The connections between micro-bumps 404 and 406 are established via silicon bridge 408 having uniform length as shown. Micro-bumps typically allow increased device interconnects on a small package footprint. The uniform length routing facilitates smaller I/O buffer pre-driver/driver designs since the range in which the component has to drive is within a small delta of each other. However, certain signals, e.g., within the mid-stack, may not need the delta to be small if they are mostly non-critical signals, e.g., testability signals. The small delta allows the I/O buffers to fit over a micro-bump array as shown in FIG. 5.

Figure 5:
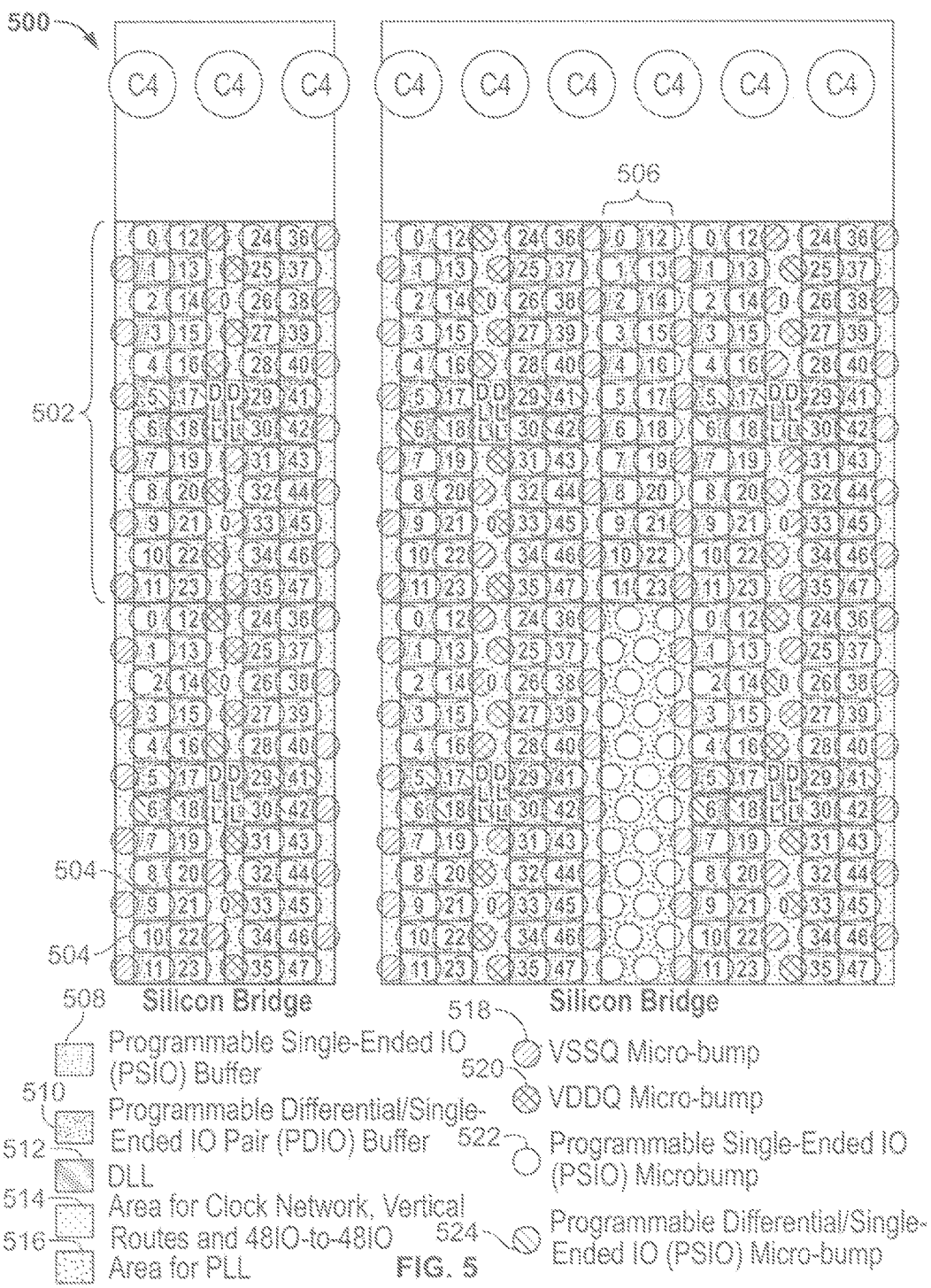
FIG. 5 is an illustrative depiction of 48-IO modules fitted over a micro-bump array according to certain embodiments.

FIG. 5 is an illustrative depiction 500 of 48-IO modules fitted over a micro-bump array according to certain embodiments. The micro-bump array in this embodiment employs a face-centered rectangular (FCR) pattern as detailed in the QDR WIO SRAM and HBM DRAM specifications and satisfying the minimum micro-bump pitch of 55 μm. The C4 bumps represent reference clock pins and power/ground bumps. The dimensions are illustrative and not limiting as to the dimensions of the micro-bumps. The mapping of 48-IO module 502 to the respective memory is routed to be of uniform length across the interface as shown in FIG. 4. Micro-bumps 504 correspond to micro-bumps 404 in FIG. 4 and can establish the uniform length routing via a silicon interposer or equivalent. FIG. 5 also shows PSIO buffers 508, PDIO buffers 510, PSIO micro-bumps 522, and PDIO micro-bumps 524. Mid-stack 506 includes areas for delay-locked loop (DLL) circuits 512, clock network/vertical routes 514, and phase-locked loop (PLL) circuits 516. FIG. 5 also shows ground voltage micro-bumps VSSQ 518 and high voltage micro-bumps VDDQ 520.

Figure 6:
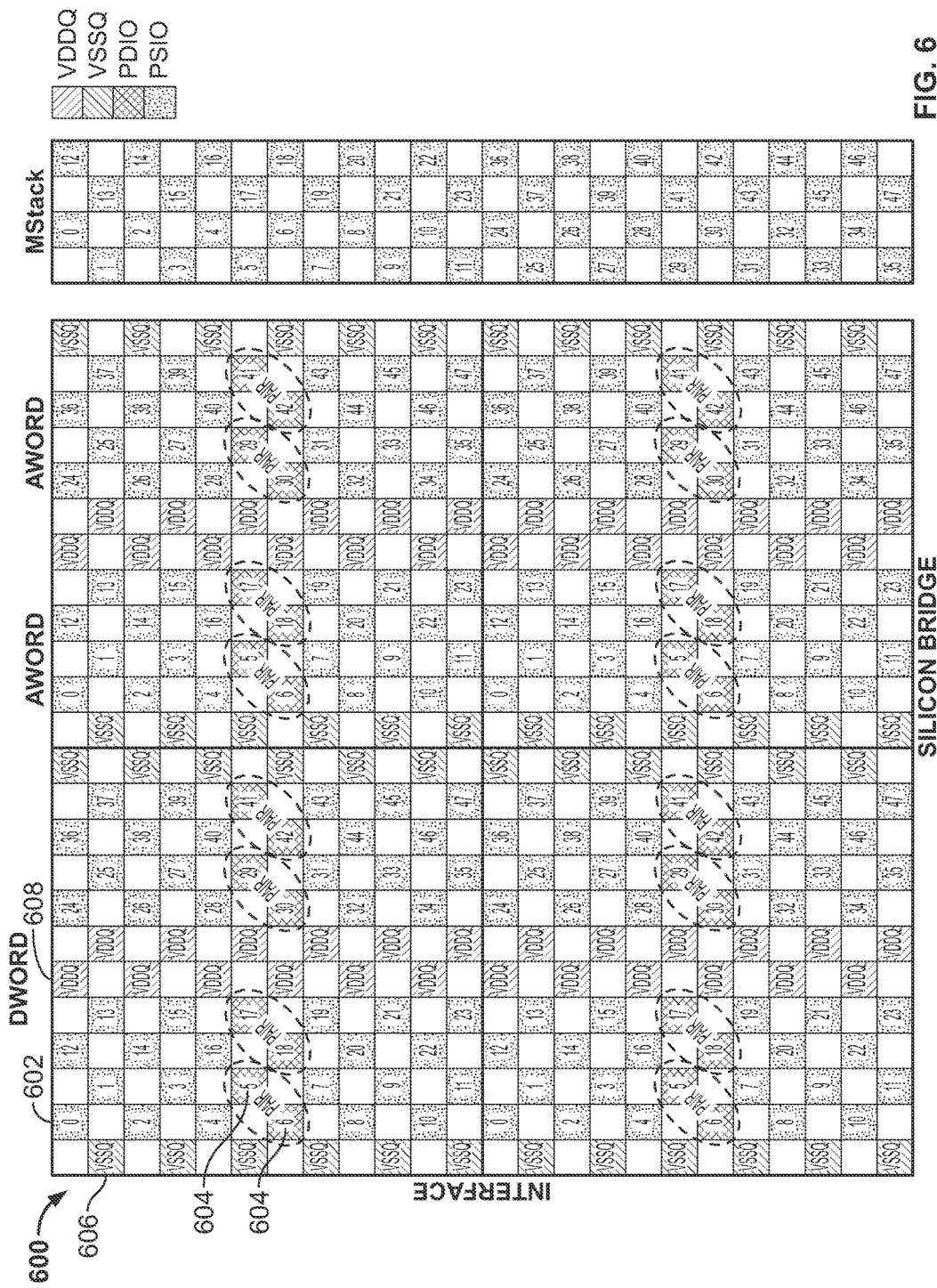
FIG. 6 is an illustrative depiction of a 48-IO module micro-bump map according to certain embodiments.

FIG. 6 is an illustrative depiction of a 48-IO module micro-bump map 600 according to certain embodiments. This depiction provides a bottom view of micro-bump map 600. Typically, such micro-bump maps for the interface block will match as close as possible to the QDR WIO SRAM and HBM DRAM micro-bump maps (excluding the mid-stack module due to blockage by the PLL). As shown, each 48-IO module includes 48 pins 602 and is divided into 40 pins as PSIO pins and 8 pins as PDIO pins.

The PSIO pins are further sub-divided into two groups (Group 0 and Group 1) with 20 I/O pins in each group. The control for all 20 I/Os is shared within the same group. Each group also includes VSSQ pins 606 and VDDQ pins 608. In some embodiments, each group may include a set of input/output configuration (IOCSR) bits for group level configurability. Each PSIO may also have its own set of IOCSR bits for individual bit configurability.

The PDIO pins include four pairs of pins 604 that can be individually programmed as either a differential I/O pair or two single-ended I/Os. Each PDIO may have its own set of IOCSR bits for individual bit configurability. If the PDIO is configured as a differential I/O pair, only the IOCSR bits for pin 0 will apply to the PDIO. In some embodiments, the pins in the 48-IO module operate source-synchronously. The clock/strobe may only be mapped to PDIO pins but its corresponding signals may be mapped to any PSIO pin (even to PSIO pins within the PDIO pins).

Figure 7A:
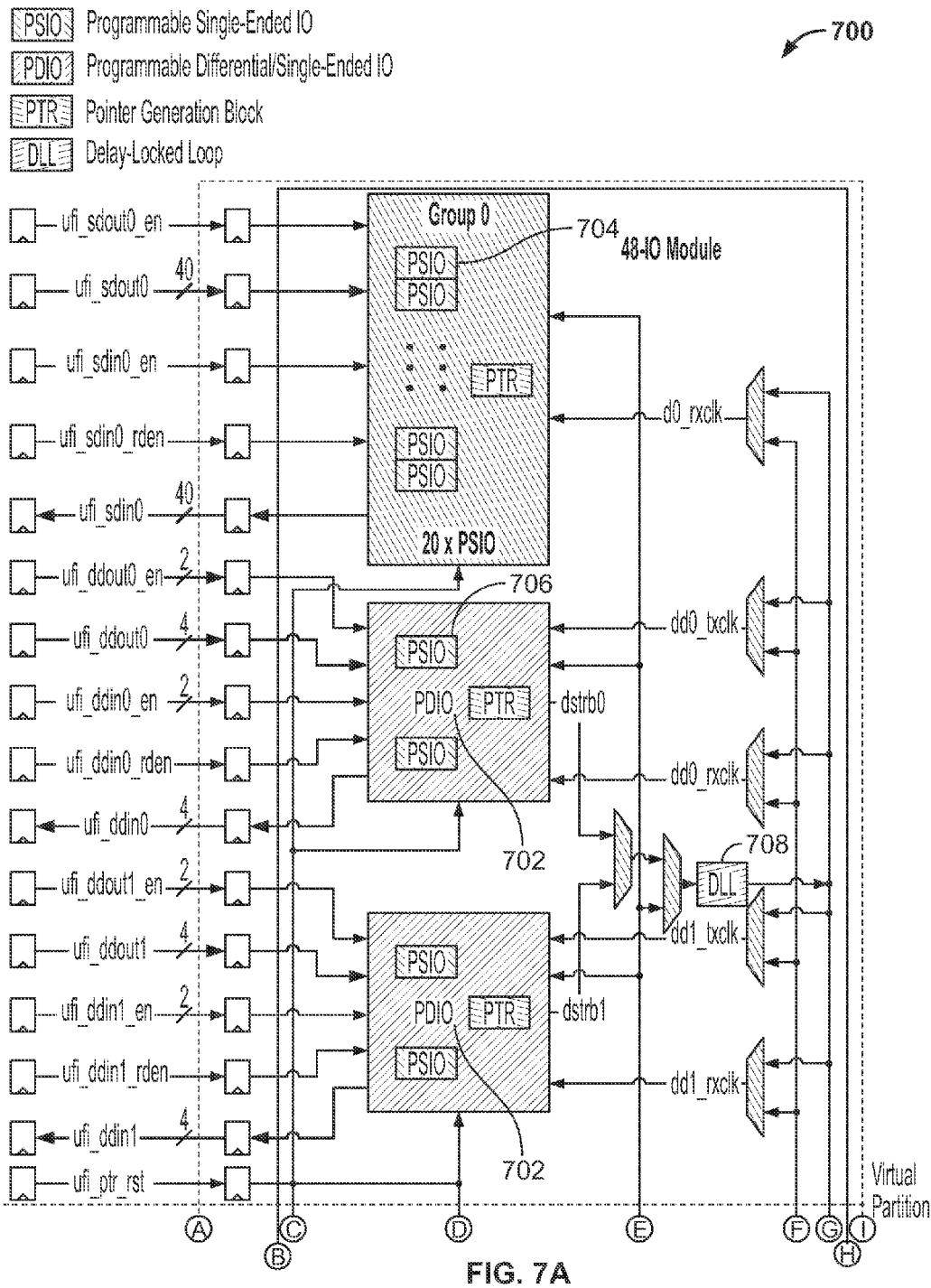
FIGS. 7A and 7B (hereinafter collectively referred to as FIG. 7) depict an illustrative 48-IO module having a partitioned clock topology according to certain embodiments.
Figure 7B:
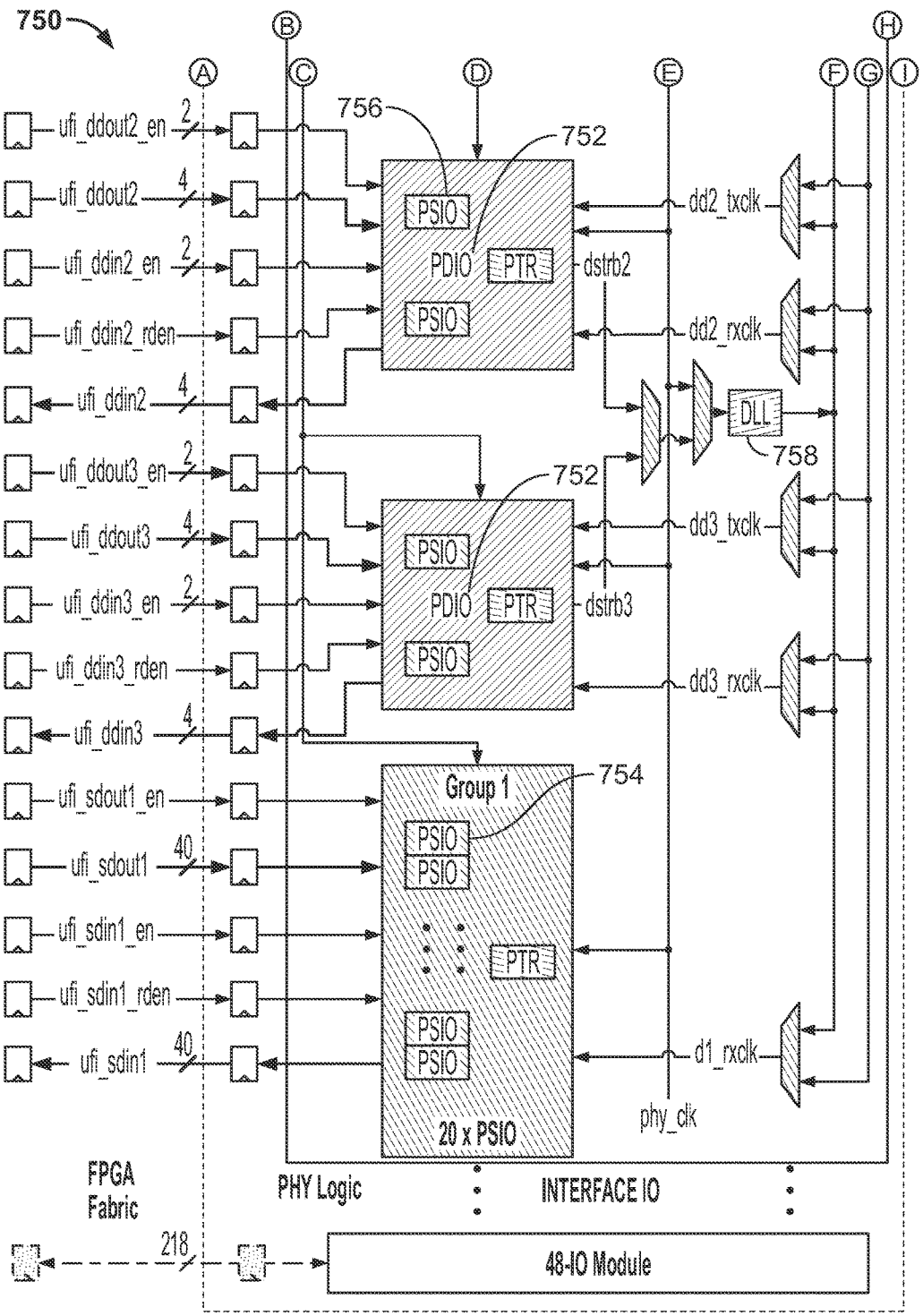

FIG. 7 is an illustrative 48-IO module having a partitioned clock topology according to certain embodiments. As shown, the clock topology within each 48-IO module is partitioned such that only one set of clocks can be redistributed from either half of the PDIO sets 702 and 752 to the other half or to itself. This allows for virtual partitioning of the 48-IO module into two 24-IO components 700 and 750 thus allowing for one 48-IO module to be shared across two adjacent channels. The pin maps for both QDR WIO SRAM and HBM DRAM are shown in Table 2 below.

TABLE 2

Pin Maps for QDR WIO SRAM and HBM DRAM

| | QDR WIO SRAM | | | | | | HBM DRAM | |
|---|---|---|---|---|---|---|---|---|
| | Command Module (Channel x/y AWORD) | | Data Module (Channel x DWORD) | | Mid-Stack | | Command Module (Channel x/y AWORD) | |
| # | Pin | IO | Pin | IO | Pin | IO | Pin | IO |
| 0 | | | CBx0 | SE-IO | | | | |
| 1 | Ax0 | SE-O | DQx0 | SE-IO | NC | | Cx0 | SE-O |
| 2 | Ax1 | SE-O | DQx1 | SE-IO | RESET_n | SE-O | Cx1 | SE-O |

TABLE 2-continued

Pin Maps for QDR WIO SRAM and HBM DRAM

| # | | | | | | | | |
|---|---|---|---|---|---|---|---|---|
| 3 | Ax2 | SE-O | DQx2 | SE-IO | NC | | Cx2 | SE-O |
| 4 | Ax3 | SE-O | DQx3 | SE-IO | WSOd | SE-I | Cx3 | SE-O |
| 5 | Ax4 | SE-O | | | WRST_n | SE-O | | |
| 6 | | | | | WRCK | SE-O | CKEx | SE-O |
| 7 | Ax6 | SE-O | DQx4 | SE-IO | ShiftWR | SE-O | Cx4 | SE-O |
| 8 | Ax5 | SE-O | DQx5 | SE-IO | CaptureWR | SE-O | Cx5 | SE-O |
| 9 | Ax8 | SE-O | DQx6 | SE-IO | UpdateWR | SE-O | Cx6 | SE-O |
| 10 | Ax7 | SE-O | DQx7 | SE-IO | SelectWIR | SE-O | Cx7 | SE-O |
| 11 | | | DBIx0 | SE-IO | WSI | SE-O | | |
| 12 | | | CBx1 | SE-IO | WSOa | SE-I | | |
| 13 | Ax10 | SE-O | DQx8 | SE-IO | NC | | Rx0 | SE-O |
| 14 | Ax9 | SE-O | DQx9 | SE-IO | WSOb | SE-I | Rx1 | SE-O |
| 15 | Ax12 | SE-O | DQx10 | SE-IO | NC | | Rx2 | SE-O |
| 16 | Ax11 | SE-O | DQx11 | SE-IO | WSOc | SE-I | Rx3 | SE-O |
| 17 | CKx_t | DIFF-O | WDQSx_t | DIFF-O | WSOe | SE-I | CKx_t | DIFF-O |
| 18 | CKx_c | | WDQSx_c | | WSOf | SE-I | CKx_c | |
| 19 | LDx_n | SE-O | DQx12 | SE-IO | TEMP0 | SE-IO | Rx4 | SE-O |
| 20 | RWx_n | SE-O | DQx13 | SE-IO | TEMP1 | SE-IO | Rx5 | SE-O |
| 21 | ERRx_n | SE-I | DQx14 | SE-IO | TEMP2 | SE-IO | | |
| 22 | CFGx | SE-O | DQx15 | SE-IO | WSOg | SE-I | | |
| 23 | | | DBIx1 | SE-IO | WSOh | SE-I | AERRx | SE-I |
| 24 | | | CBx2 | SE-IO | | | | |
| 25 | Ay0 | SE-O | DQx16 | SE-IO | | | Cy0 | SE-O |
| 26 | Ay1 | SE-O | DQx17 | SE-IO | | | Cy1 | SE-O |
| 27 | Ay2 | SE-O | DQx18 | SE-IO | | | Cy2 | SE-O |
| 28 | Ay3 | SE-O | DQx19 | SE-IO | | | Cy3 | SE-O |
| 29 | Ay4 | SE-O | DQx28 | SE-IO | | | | |
| 30 | | | | | | | CKEy | SE-O |
| 31 | Ay6 | SE-O | DQx20 | SE-IO | | | Cy4 | SE-O |
| 32 | Ay5 | SE-O | DQx21 | SE-IO | | | Cy5 | SE-O |
| 33 | Ay8 | SE-O | DQx22 | SE-IO | | | Cy6 | SE-O |
| 34 | Ay7 | SE-O | DQx23 | SE-IO | | | Cy7 | SE-O |
| 35 | | | DBIx2 | SE-IO | | | | |
| 36 | | | CBx3 | SE-IO | | | | |
| 37 | Ay10 | SE-O | DQx24 | SE-IO | | | Ry0 | SE-O |
| 38 | Ay9 | SE-O | DQx25 | SE-IO | | | Ry1 | SE-O |
| 39 | Ay12 | SE-O | DQx26 | SE-IO | | | Ry2 | SE-O |
| 40 | Ay11 | SE-O | DQx27 | SE-IO | | | Ry3 | SE-O |
| 41 | CKy_t | DIFF-O | RDQSx_t | DIFF-I | | | CKy_t | DIFF-O |
| 42 | CKy_c | | RDQSx_c | | | | CKy_c | |
| 43 | LDy_n | SE-O | DQx30 | SE-IO | | | Ry4 | SE-O |
| 44 | RWy_n | SE-O | DQx29 | SE-IO | | | Ry5 | SE-O |
| 45 | ERRy_n | SE-I | DBIx3 | SE-IO | | | | |
| 46 | CFGy | SE-O | DQx31 | SE-IO | | | | |
| 47 | | | | | | | AERRy | SE-I |

HBM DRAM

Data Module (Channel x)

| | Pin | | | | | Mid-Stack | |
|---|---|---|---|---|---|---|---|
| # | DWORD0 | DWORD1 | DWORD2 | DWORD3 | IO | Pin | IO |
| 0 | DMx0 | DMx4 | DMx8 | DMx12 | SE-IO | | |
| 1 | DQx0 | DQx32 | DQx64 | DQx96 | SE-IO | NC | |
| 2 | DQx1 | DQx33 | DQx65 | DQx97 | SE-IO | RESET_n | SE-O |
| 3 | DQx2 | DQx34 | DQx66 | DQx98 | SE-IO | NC | |
| 4 | DQx3 | DQx35 | DQx67 | DQx99 | SE-IO | WSOd | SE-I |
| 5 | PARx0 | PARx1 | PARx2 | PARx3 | SE-IO | WRST_n | SE-O |
| 6 | | | | | | WRCK | SE-O |
| 7 | DQx4 | DQx36 | DQx68 | DQx100 | SE-IO | ShiftWR | SE-O |
| 8 | DQx5 | DQx37 | DQx69 | DQx101 | SE-IO | CaptureWR | SE-O |
| 9 | DQx6 | DQx38 | DQx70 | DQx102 | SE-IO | UpdateWR | SE-O |
| 10 | DQx7 | DQx39 | DQx71 | DQx103 | SE-IO | SelectWIR | SE-O |
| 11 | DBIx0 | DBIx4 | DBIx8 | DBIx12 | SE-IO | WSI | SE-O |
| 12 | DMx1 | DMx5 | DMx9 | DMx13 | SE-IO | WSOa | SE-I |
| 13 | DQx8 | DQx40 | DQx72 | DQx104 | SE-IO | NC | |
| 14 | DQx9 | DQx41 | DQx73 | DQx105 | SE-IO | WSOb | SE-I |
| 15 | DQx10 | DQx42 | DQx74 | DQx106 | SE-IO | NC | |
| 16 | DQx11 | DQx43 | DQx75 | DQx107 | SE-IO | WSOc | SE-I |
| 17 | WDQSx0_t | WDQSx1_t | WDQSx2_t | WDQSx3_t | DIFF-O | WSOe | SE-I |
| 18 | WDQSx0_c | WDQSx1_c | WDQSx2_c | WDQSx3_c | | WSOf | SE-I |
| 19 | DQx12 | DQx44 | DQx76 | DQx108 | SE-IO | TEMP0 | SE-IO |
| 20 | DQx13 | DQx45 | DQx77 | DQx109 | SE-IO | TEMP1 | SE-IO |
| 21 | DQx14 | DQx46 | DQx78 | DQx110 | SE-IO | TEMP2 | SE-IO |
| 22 | DQx15 | DQx47 | DQx79 | DQx111 | SE-IO | WSOg | SE-I |

TABLE 2-continued

Pin Maps for QDR WIO SRAM and HBM DRAM

| | | | | | | | |
|---|---|---|---|---|---|---|---|
| 23 | DBIx1 | DBIx5 | DBIx9 | DBIx13 | SE-IO | WSOh | SE-I |
| 24 | DMx2 | DMx6 | DMx10 | DMx14 | SE-IO | | |
| 25 | DQx16 | DQx48 | DQx80 | DQx112 | SE-IO | | |
| 26 | DQx17 | DQx49 | DQx81 | DQx113 | SE-IO | | |
| 27 | DQx18 | DQx50 | DQx82 | DQx114 | SE-IO | | |
| 28 | DQx19 | DQx51 | DQx83 | DQx115 | SE-IO | | |
| 29 | RDQSx0_t | RDQSx1_t | RDQSx2_t | RDQSx3_t | DIFF-I | | |
| 30 | RDQSx0_c | RDQSx1_c | RDQSx2_c | RDQSx3_c | | | |
| 31 | DQx20 | DQx52 | DQx84 | DQx116 | SE-IO | | |
| 32 | DQx21 | DQx53 | DQx85 | DQx117 | SE-IO | | |
| 33 | DQx22 | DQx54 | DQx86 | DQx118 | SE-IO | | |
| 34 | DQx23 | DQx55 | DQx87 | DQx119 | SE-IO | | |
| 35 | DBIx2 | DBIx6 | DBIx10 | DBIx14 | SE-IO | | |
| 36 | DMx3 | DMx7 | DMx11 | DMx15 | SE-IO | | |
| 37 | DQx24 | DQx56 | DQx88 | DQx120 | SE-IO | | |
| 38 | DQx25 | DQx57 | DQx89 | DQx121 | SE-IO | | |
| 39 | DQx26 | DQx58 | DQx90 | DQx122 | SE-IO | | |
| 40 | DQx27 | DQx59 | DQx91 | DQx123 | SE-IO | | |
| 41 | DERRx0 | DERRx1 | DERRx2 | DERRx3 | SE-I | | |
| 42 | | | | | | | |
| 43 | DQx28 | DQx60 | DQx92 | DQx124 | SE-IO | | |
| 44 | DQx29 | DQx61 | DQx93 | DQx125 | SE-IO | | |
| 45 | DQx30 | DQx62 | DQx94 | DQx126 | SE-IO | | |
| 46 | DQx31 | DQx63 | DQx95 | DQx127 | SE-IO | | |
| 47 | DBIx3 | DBIx7 | DBIx11 | DBIx15 | SE-IO | | |

If the 48-IO module is configured to be a data module, two PDIOs (one from each half of the virtual partition) will be used as a differential pair for the output (WDQS_t and WDQS_c) and input (RDQS_t and RDQS_c) strobe pins. The remaining PSIOs 706 and 756 (including the remaining PSIOs 704 and 754 within the unused PDIO groups) can be mapped as I/O pins.

DLL 708 attached to the half that is mapped as the output strobe pins may be used to delay the output strobe pair to center it on the outgoing data that is mapped to the PSIOs. DLL 758 attached to the half that is mapped as the input strobe pins may be used to delay the incoming read strobe to center it on the incoming data that is mapped to the PSIOs. In embodiments where the 48-IO module is configured to be a command module, only the PSIOs within the same half of the PDIO (including unused PSIO within the unused PDIO group) can be used as mappings for the command pins. Either PDIO within the same half may be mapped as the differential clock output (CK_t and CK_c). The DLL attached to the same half is then used to delay the clock output to center it on the outgoing command bus that is mapped to the PSIO in its half.

Figure 8A:
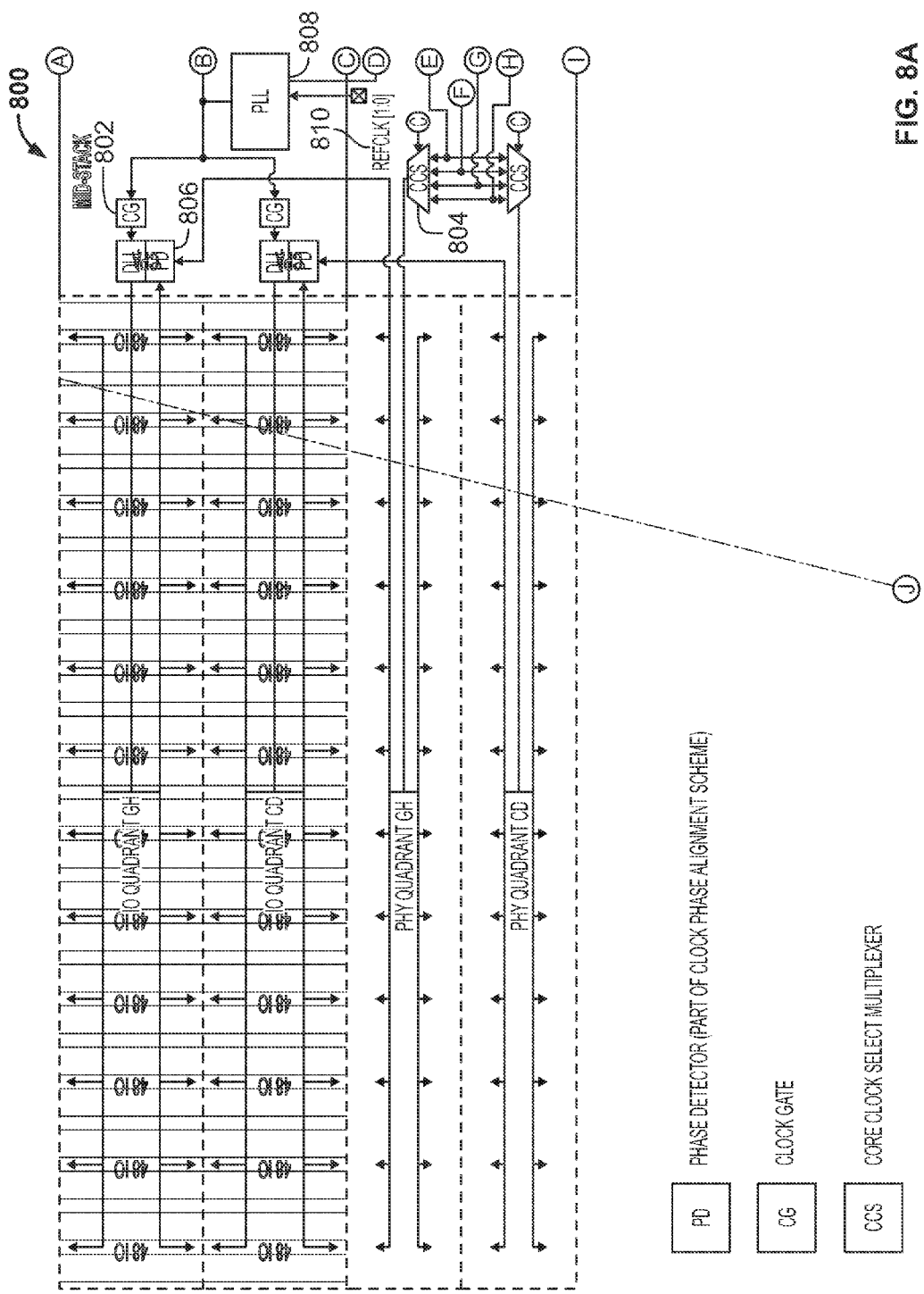
FIGS. 8A, 8B, and 8C (hereinafter collectively referred to as FIG. 8) depict an illustrative clock network topology for an interface block according to certain embodiments.
Figure 8B:
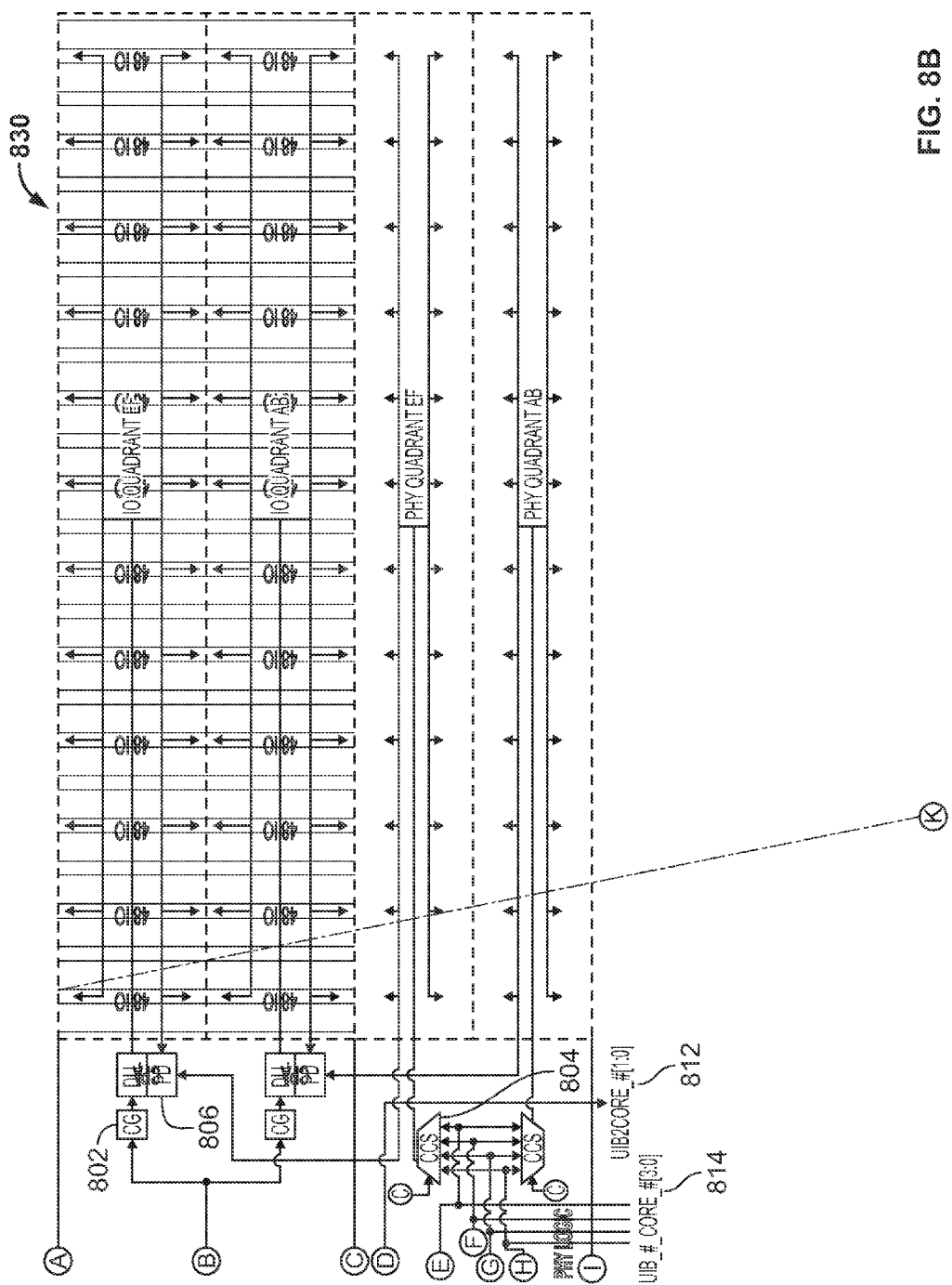
Figure 8C:
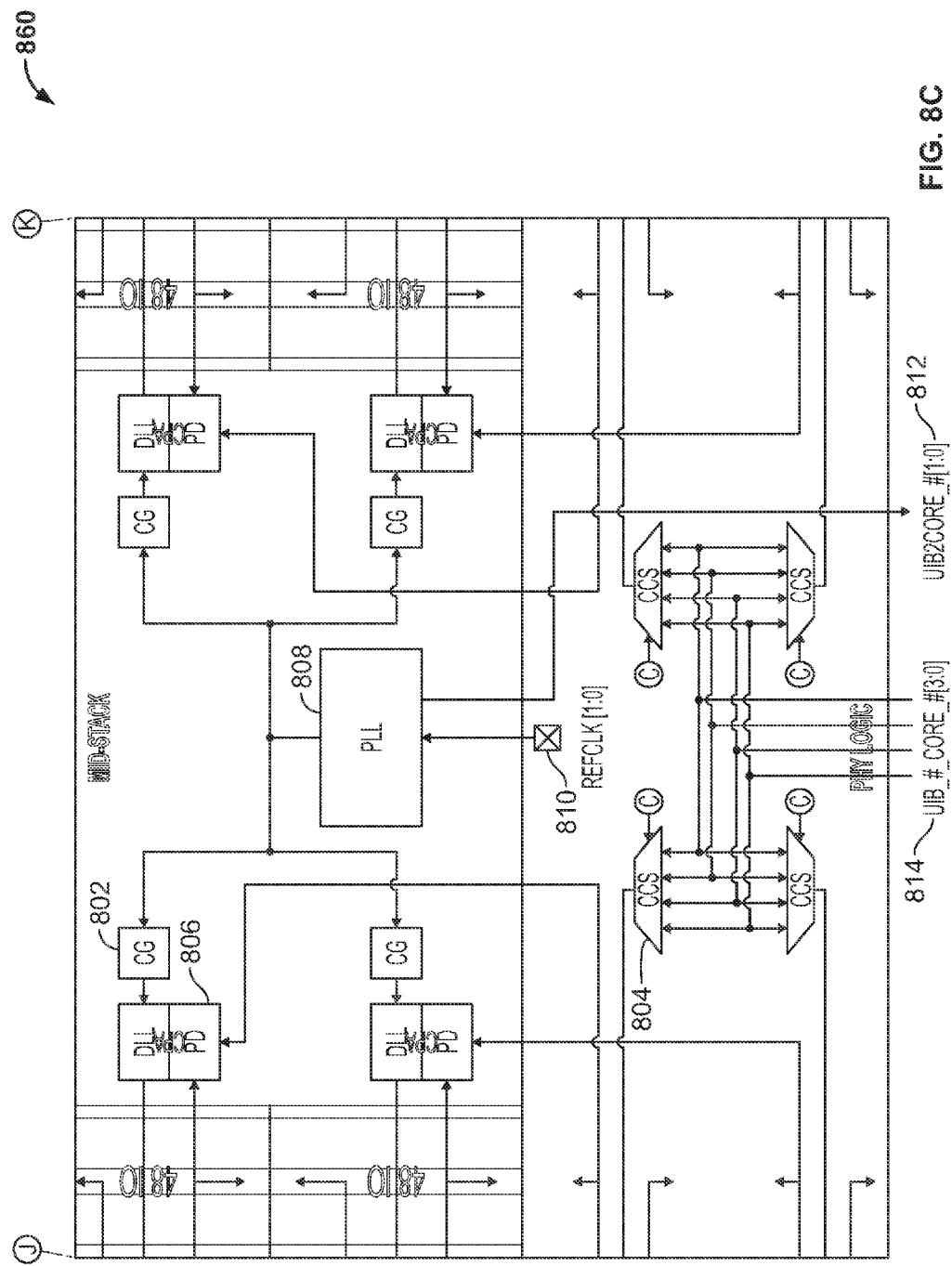
Figure 9A:
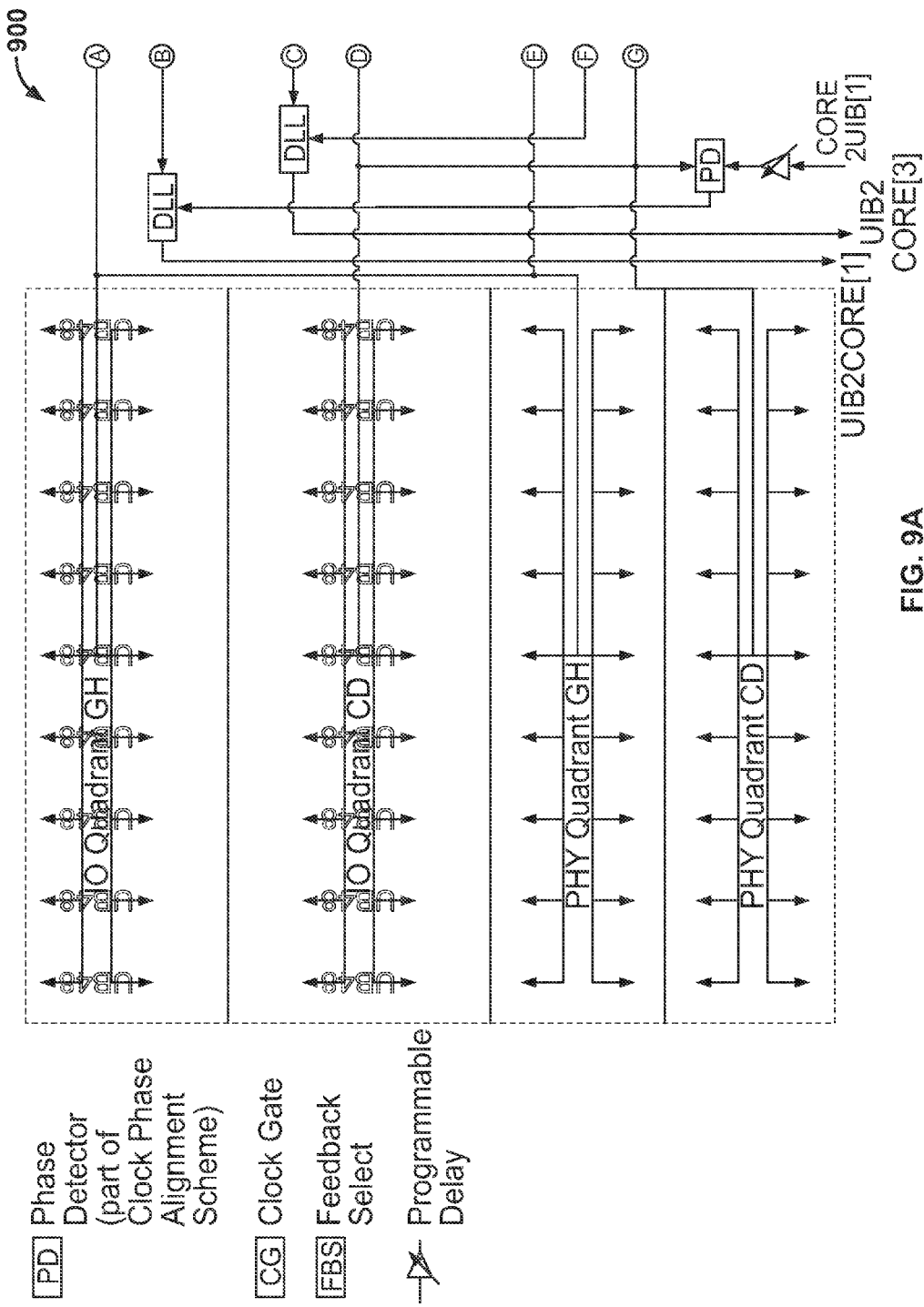

FIG. 8 is an illustrative clock network topology 800 for an interface block according to certain embodiments. Each interface block is clocked by one PLL that resides in the middle of the interface block floor plan (e.g., located on top half of the mid-stack module as shown in FIG. 5). The mid-stack module in FIG. 8 is not drawn to scale. PLL 808 receives its reference clock 810 from a pair of reference clock pins (e.g., C4 bumps shown in FIG. 5) that is located over the PHY logic area. PLL 808 outputs one PHY clock that feeds four independent PHY clock networks (grouped in quadrant pairs as shown in FIG. 8). Each PHY clock network includes the Clock Gate (CG) blocks 802, Core Clock Selector (CCS) blocks 804, and Clock Phase Alignment (CPA) blocks 806. CG blocks 802 provide the ability to gate the root of the PHY clock in the quadrant that is not used. CCS blocks 804 are controlled using IOCSR configuration bits (e.g., 2-bits for each CCS) and provide the ability to select the core clock source (up to four core clock networks supported labeled 814). CPA blocks 806 include a phase detector (PD) and a DLL that provides the ability to either align the PHY clock network phase to the core clock network phase, or vice versa, to facilitate core-to-PHY (C2P) and PHY-to-core (P2C) transfers. FIG. 9 illustrates an illustrative clock network topology 900 for an interface block with reverse alignment where the PHY clock is aligned to the core clock.

The four independent clock quadrants (labeled as Quadrants AB, CD, EF and GH) allow the interface block to operate in four different clock domains of the same frequency but of different phases. Each clock quadrant is phase aligned via the CPA to the respective core clock as programmed by the CCS. This allows the maximum timing budget for crossings between the core-to-interface and interface-to-core. This flexibility may be useful for applications with HBM DRAM where all available channels have no phase/skew requirements. In those applications, a module that interfaces with the interface block may choose to clock the interface block with the same clock source as itself (and the same frequency as HBM DRAM). For applications with QDR WIO SRAM, the core clock that feeds the PHY logic may be configured to select the same source, i.e., all four CCS may be configured to select the same core clock source. This indirectly implies that the pipeline flops in the PHY logic as well as the soft logic in the core fabric also may source from the same core clock network. This minimizes the channel-to-channel skew which is a requirement for at least QDR WIO SRAM applications.

PLL 808 also provides two synchronous clock outputs 812 to the core fabric. One clock output may represent the full frequency clock while the other clock output may represent the full frequency clock divided by a factor of N. The latter clock output is expected to be used as the memory controller clock for the memory interface. The full frequency clock output can be configured to be supplied back to the interface block via the core clock mesh network to clock the PHY logic flops as well as the soft logic that interfaces with the interface block as shown in FIG. 10.

Figure 10A:
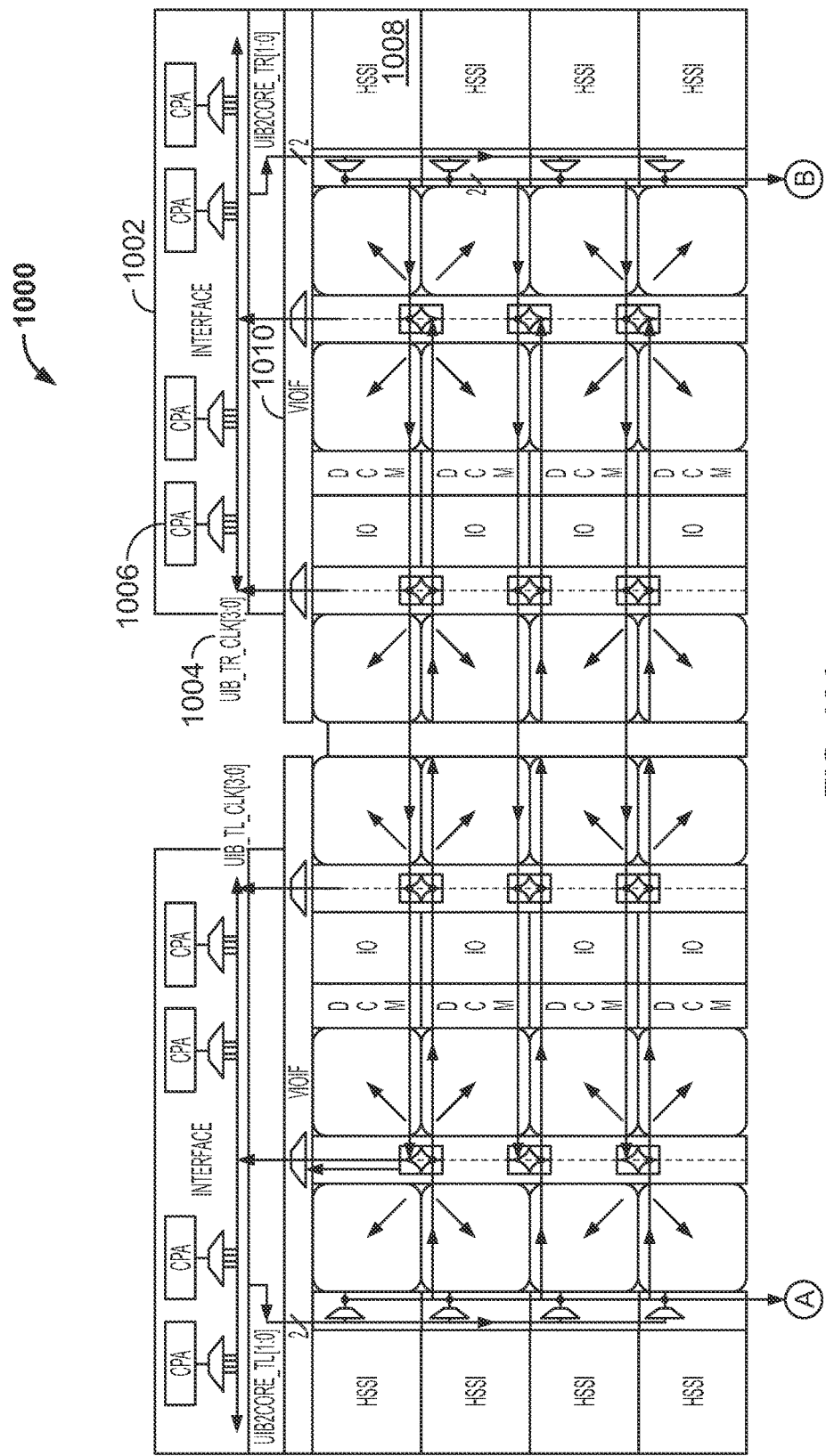
FIGS. 10A and 10B (hereinafter collectively referred to as FIG. 10) depict an illustrative clock network topology for an interface block integrated into a programmable device clock network according to certain embodiments.
Figure 10B:
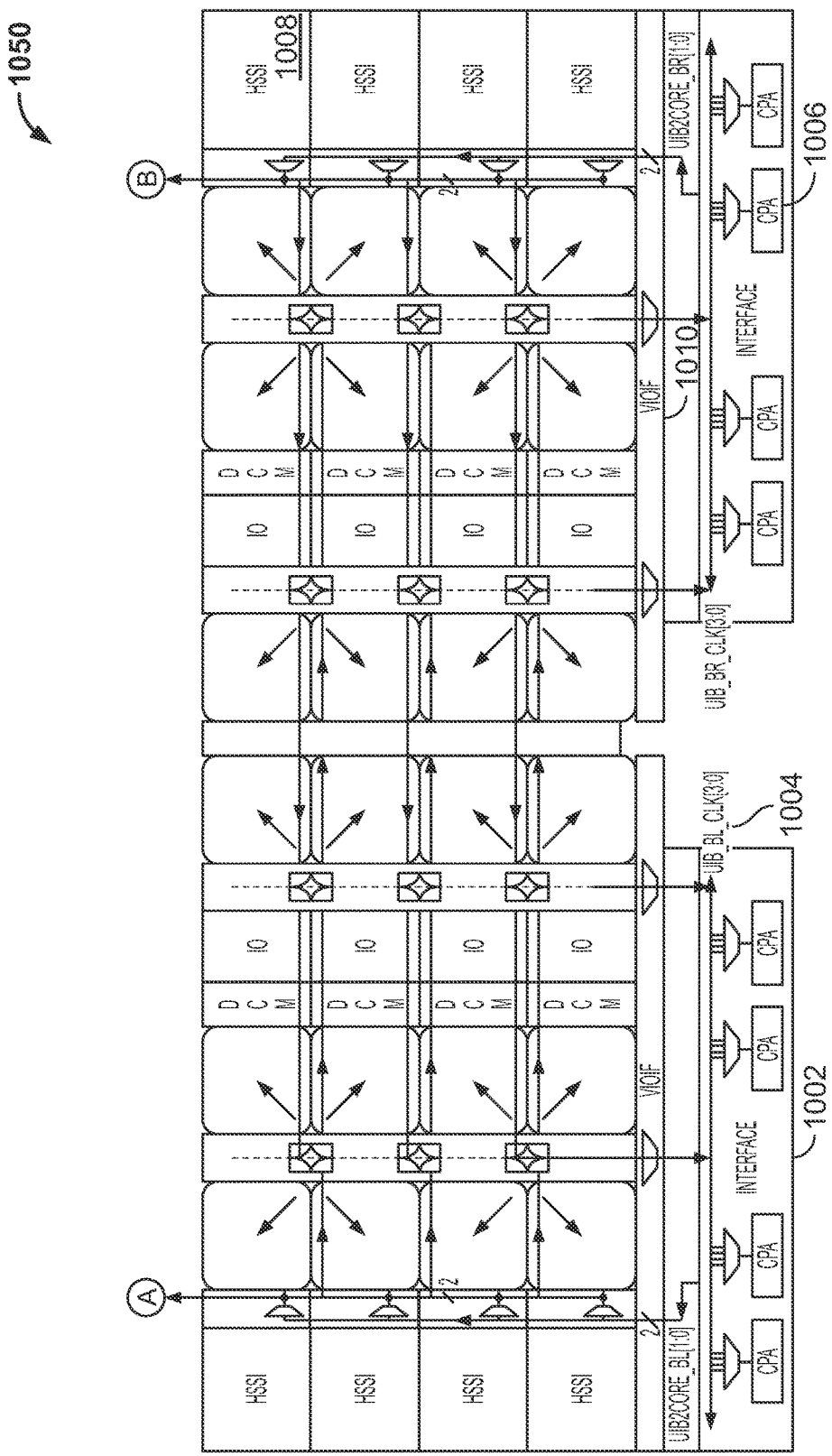

FIG. 10 is an illustrative clock network topology 1000 for an interface block integrated into a programmable device clock network according to certain embodiments. The topology includes, among other components, interface block 1002, clock lines 1004, CPA blocks 1006, and High Speed Serial Interface (HSSI) modules 1008. In some embodiments, memory controller (MC) soft logic is responsible for handling the clock crossing between the divide by N clock output and the full frequency clock output if the divide by N clock output is used. The core clock source can be driven from any clock region and driven into the interface block 1002 from the clock spine and multiplexed through VIOIF 1010.

The entire interface block is expected to be clocked at the same frequency as the memory device that it is interfacing to. For example, the interface block is clocked (with the PHY clock) at 750 MHz if it is interfacing to the QDR WIO SRAM operating at 750 MHz. However, there will be up to eight clock domains operating potentially at different phases albeit being the same frequency. These clock domains map directly into the four I/O quadrants and four PHY quadrants shown in FIG. 8. Each I/O quadrant contains twelve 48-IO modules.

Figure 11A:
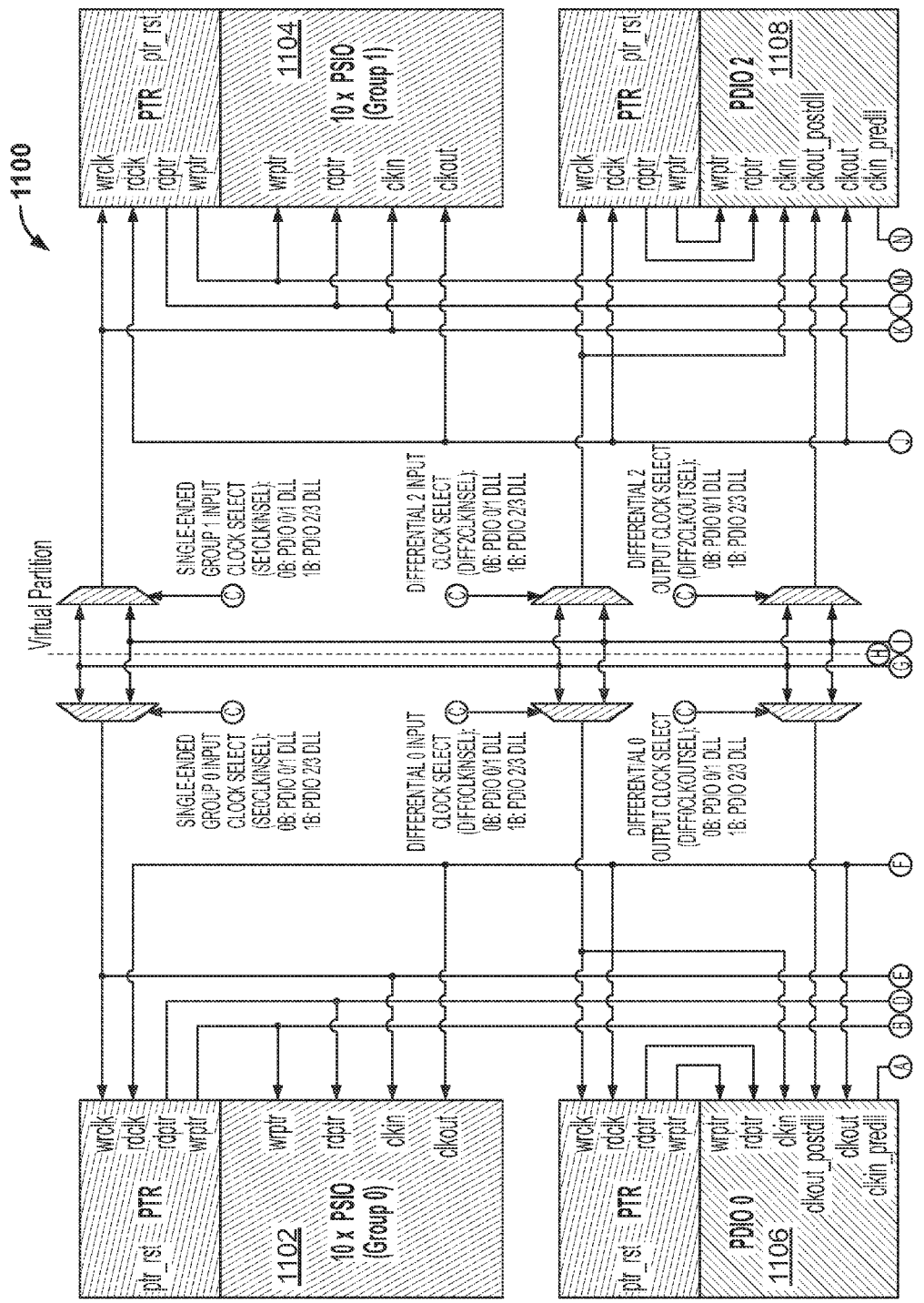
FIGS. 11A and 11B (hereinafter collectively referred to as FIG. 11) depict an illustrative 48-IO module having a clock domain partitioning topology according to certain embodiments.
Figure 11B:
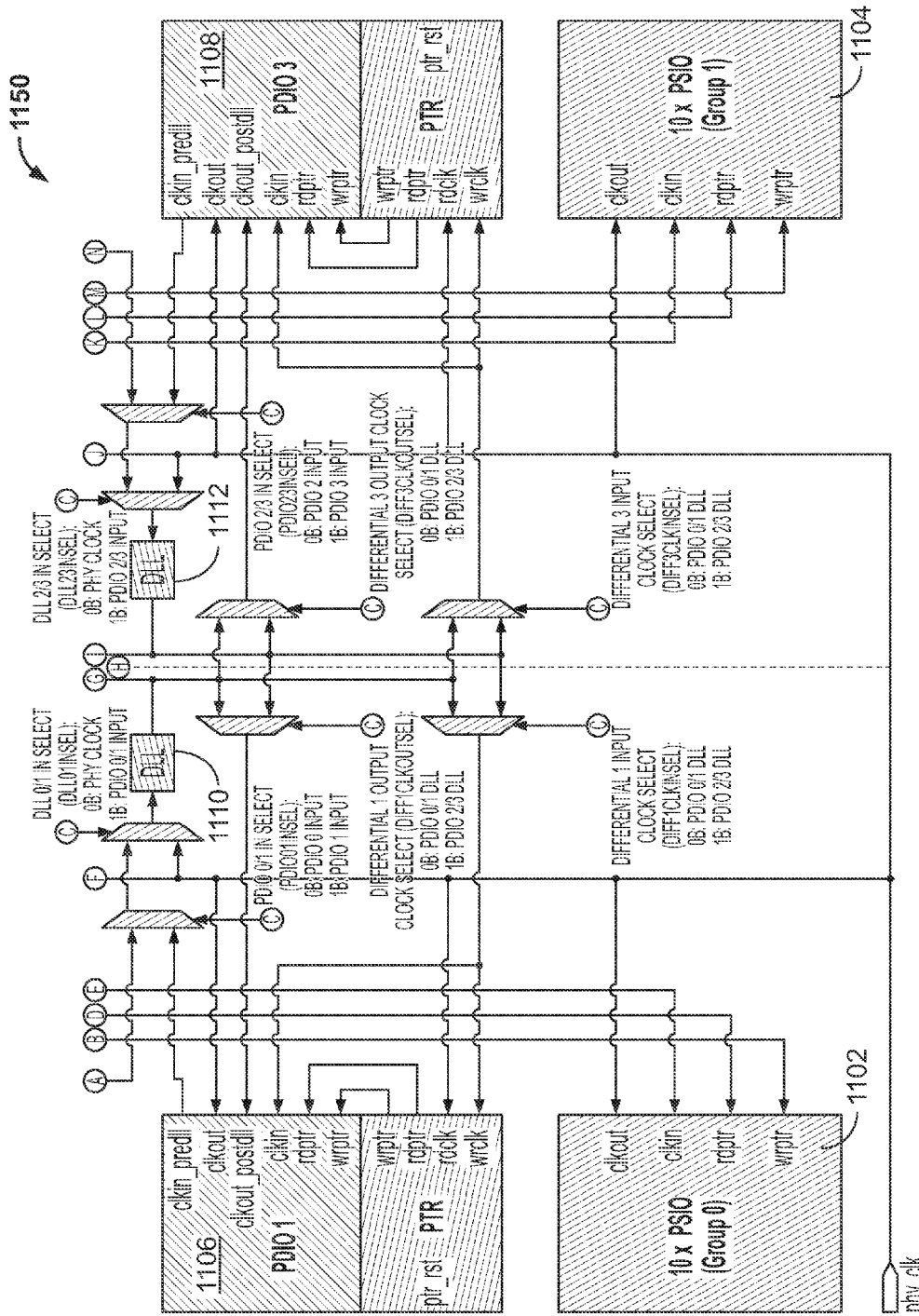

FIG. 11 is an illustrative 48-IO module 1100 having a clock domain partitioning topology according to certain embodiments. Each 48-IO module has a pair of clock domains that can be sourced to supply to each I/O group (groups 0 and 1). Depending on the mapping of the 48-IO module, each I/O group may be configured to source from either clock domain. The PSIO groups 1102 and 1104 may only have configurability on their sampling clock for the read FIFO while PDIO groups 1106 and 1108 may have configurability on both their sampling clock for the read FIFO as well as their transmit clock. Module 1100 includes two DLLs 1110 and 1112 capable of delays of at least one clock period (tCK) at, e.g., approximately 20 ps step sizes. The clock period may be greater or smaller than 20 ps as suitable for the application. Each DLL may be configured to source its input clock from the input signal from either PDIO pair in the same half or the PHY clock. The input signal is typically used to delay the input read data strobe for first stage data capture. The PHY clock is typically used to delay the output clock or output write data strobe to center in the middle of the command or write data window. Table 3 below shows example configurations for command and data modules for module 1100 and its inputs as depicted in FIG. 11.

TABLE 3

Example Configuration for Command and Data Modules

| Configuration | QDR WIO SRAM | | HBM DRAM | | Comments |
|---|---|---|---|---|---|
| | Command | Data | Command | Data | |
| PDIO01INSEL | N/A | N/A | N/A | N/A | |
| PDIO23INSEL | N/A | 1b | N/A | 0b | |
| DLL01INSEL | 0b | 0b | 0b | 0b | |
| DLL23INSEL | 0b | 1b | 0b | 1b | |
| DIFF0CLKOUTSEL | 0b | N/A | 0b | N/A | |
| DIFF1CLKOUTSEL | 0b | 0b | 0b | 0b | |
| DIFF2CLKOUTSEL | 1b | N/A | 1b | N/A | |
| DIFF3CLKOUTSEL | 1b | N/A | 1b | N/A | |
| DIFF0CLKINSEL | N/A | N/A | N/A | 1b | |
| DIFF1CLKINSEL | N/A | N/A | N/A | N/A | |
| DIFF2CLKINSEL | N/A | 1b | N/A | N/A | |
| DIFF3CLKINSEL | N/A | N/A | N/A | N/A | |
| SE0CLKINSEL | N/A | 1b | N/A | 1b | |
| SE1CLKINSEL | N/A | 1b | N/A | 1b | |

The MC that interfaces with the interface block (and clock) to form the memory subsystem may operate in either the same clock domain as the interface block or be partitioned into up to three (e.g., typically two partitions) interdependent clock domains, i.e., the core clock domain, the memory controller clock domain, and the PHY clock domain. Typically, the core clock and the memory controller clock operate at the same frequency. However, this may vary depending on the configuration of the clock domains. For configurations where they are not the same frequency, the MC soft logic may handle dividing the memory controller clock by some constant K to meet the desired core clock frequency. The source clock may be optionally derived (via the core clock mesh) from the two core clocks that the PLL provides.

Figure 12:
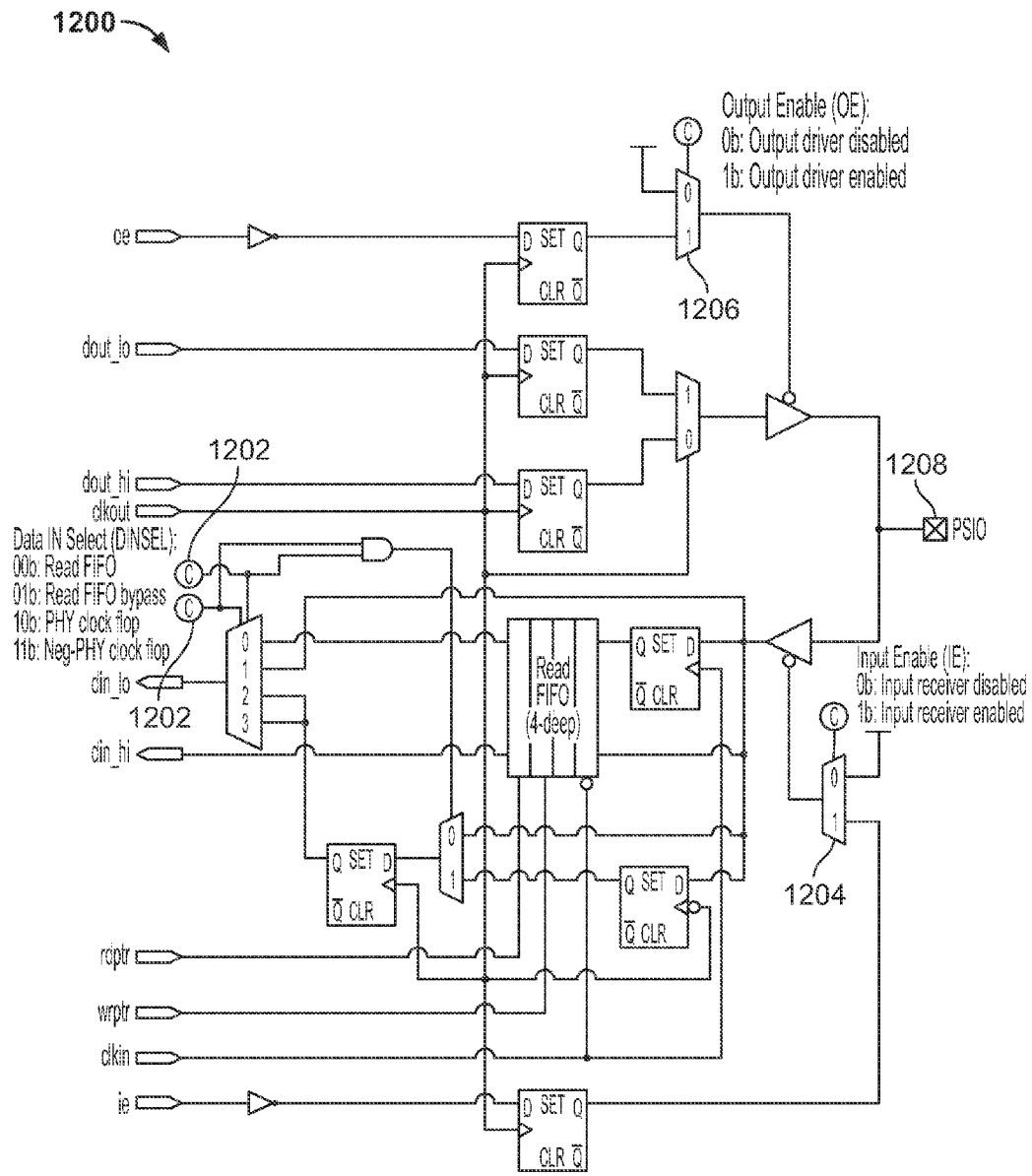
FIG. 12 is an illustrative logical representation of a PSIO according to certain embodiments.

FIG. 12 is an illustrative logical representation of a PSIO according to certain embodiments. In the embodiment shown, PSIO 1200 is disposed within a 48-IO module. In other embodiments, the implementation of the PSIO may differ from this representation but the main functionality and programmability shown here is preserved. PSIO 1200 includes one or more of programmability options, configurability options, and IOCSR options (more details provided in Table 4 below). Output Enable (OE) 1206 bit may statically enable/disable the output driver. When enabled, the dynamic control of the output enable is from the "oe" signal (signal 1306 in FIG. 13). Input Enable (IE) bit 1204 may statically enable/disable the input receiver. When enabled, the dynamic control of the input enable is from the "ie" signal (signal 1304 in FIG. 13). Data IN Select (DINSEL) bits 1202 (corresponding to signals 1302 in FIG. 13) may statically select the sources for the input data. The input data may be sourced from the read FIFO, directly from the input (bypassing the read FIFO), sampled on the positive edge of the output clock, or sampled on the negative edge of the output clock (e.g., staged on the rising edge of the output clock to enable a full cycle timing from the pipelines to the core).

Figure 13:
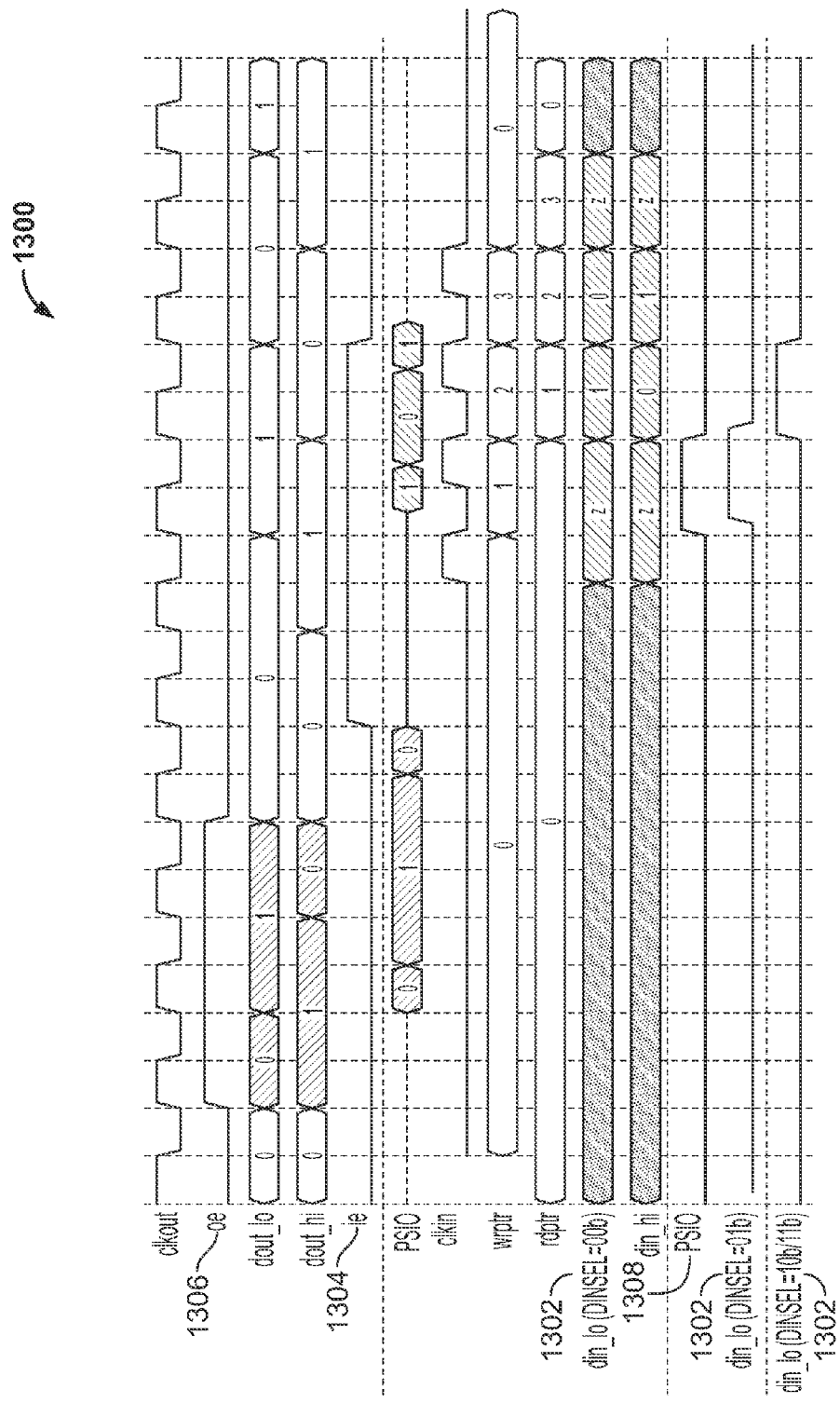
FIG. 13 is an illustrative timing diagram of a PSIO according to certain embodiments.

FIG. 13 is an illustrative timing diagram of a PSIO according to certain embodiments. For example, FIG. 13 shows a timing diagram 1300 of how PSIO 1200 behaves based on the various controls as configured according to Table 4 below. For example, if the configuration bits are set as OE=0, IE=1, and DINSEL=01, the PSIO input data is expected to be asynchronous to any clocks within the subsystem. The PSIO input data is further expected to map to asynchronous input signals (e.g. ERR_n for QDR WIO SRAM. In another example, if the configuration bits are set as OE=1, IE=0, and DINSEL=XX, the PSIO output 1208/1308 is expected to be synchronous to the rising edge of the output clock. PSIO output 1208 is further expected to map to SDR/DDR output signals (e.g. A, LD_n, RW_n, CFG for QDR WIO SRAM and C, R for HBM DRAM). The various PSIO configurations expected based on the configuration bits are shown below in Table 4. These configuration bits may be provided using programmable logic or circuitry, such as an FPGA. Unused configurations are indicated with asterisks (*).

TABLE 4

Expected PSIO Configurations

| Configuration | | | | |
|---|---|---|---|---|
| OE | IE | DINSEL | IO | Comments |
| 0 | 0 | XX | TRI-STATE | PSIO is disabled and unused. Clocks to the PSIO can be gated and powered down. Expected to map to all unused PSIO buffers. |
| 0* | 1* | 00* | INPUT | PSIO input data is expected to be source-synchronous to the input clock (clkin). Data is sampled with clkin and stored into the read FIFO to be drained by the core control. No expected mappings to both QDR WIO SRAM and HBM DRAM. |
| 0 | 1 | 01 | INPUT | PSIO input data is expected to be asynchronous to any clocks within the subsystem. Expected to map to asynchronous input signals (e.g. ERR_n for QDR WIO SRAM). |
| 0 | 1 | 10 | INPUT | PSIO input data is expected to be synchronous to the rising edge of the output clock. Expected to map to SDR input signals (e.g. AERR for HBM DRAM). |
| 0 | 1 | 11 | INPUT | PSIO input data is expected to be synchronous to the falling edge of the output clock. Expected to map to SDR input signals (e.g. AERR for HBM DRAM). |
| 1 | 0 | XX | OUTPUT | PSIO output is expected to be synchronous to the rising edge of the output clock. Expected to map to SDR/DDR output signals (e.g. A, LD_n, RW_n, CFG for QDR WIO SRAM and C, R for HBM DRAM). |
| 1 | 1 | 00 | INOUT | PSIO output and input is expected to be synchronous to the rising edge of the output clock and rising edge of the input clock respectively. Expected to map to source-synchronous I/O signals (e.g. DQ, CB, DBI). |
| 1* | 1* | 01* | INOUT | PSIO output is expected to be synchronous to the rising edge of the output clock and PSIO input is expected to be asynchronous to any clocks within the subsystem. No expected mappings to both QDR WIO SRAM and HBM DRAM. |
| 1* | 1* | 10* | INOUT | PSIO output and input is expected to be synchronous to the rising edge of the output clock. No expected mappings to both QDR WIO SRAM and HBM DRAM. |
| 1* | 1* | 11* | INOUT | PSIO output and input data is expected to be synchronous to the rising edge of the output clock and the falling edge of the output clock respectively. No expected mappings to both QDR WIO SRAM and HBM DRAM. |

Figure 14A:
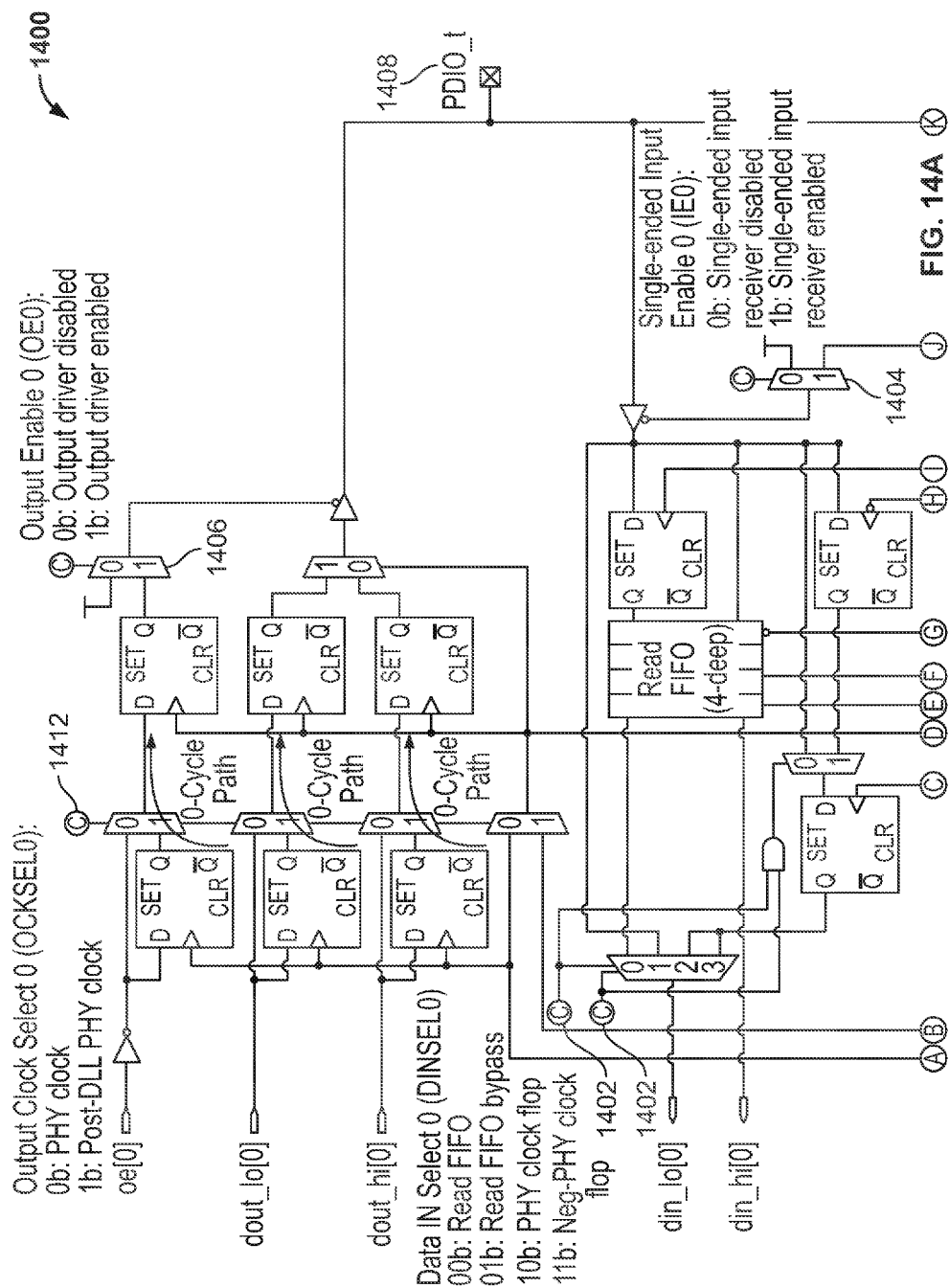
FIGS. 14A, 14B, and 14C (hereinafter collectively referred to as FIG. 14) depict an illustrative logical representation of a PDIO according to certain embodiments.
Figure 14B:
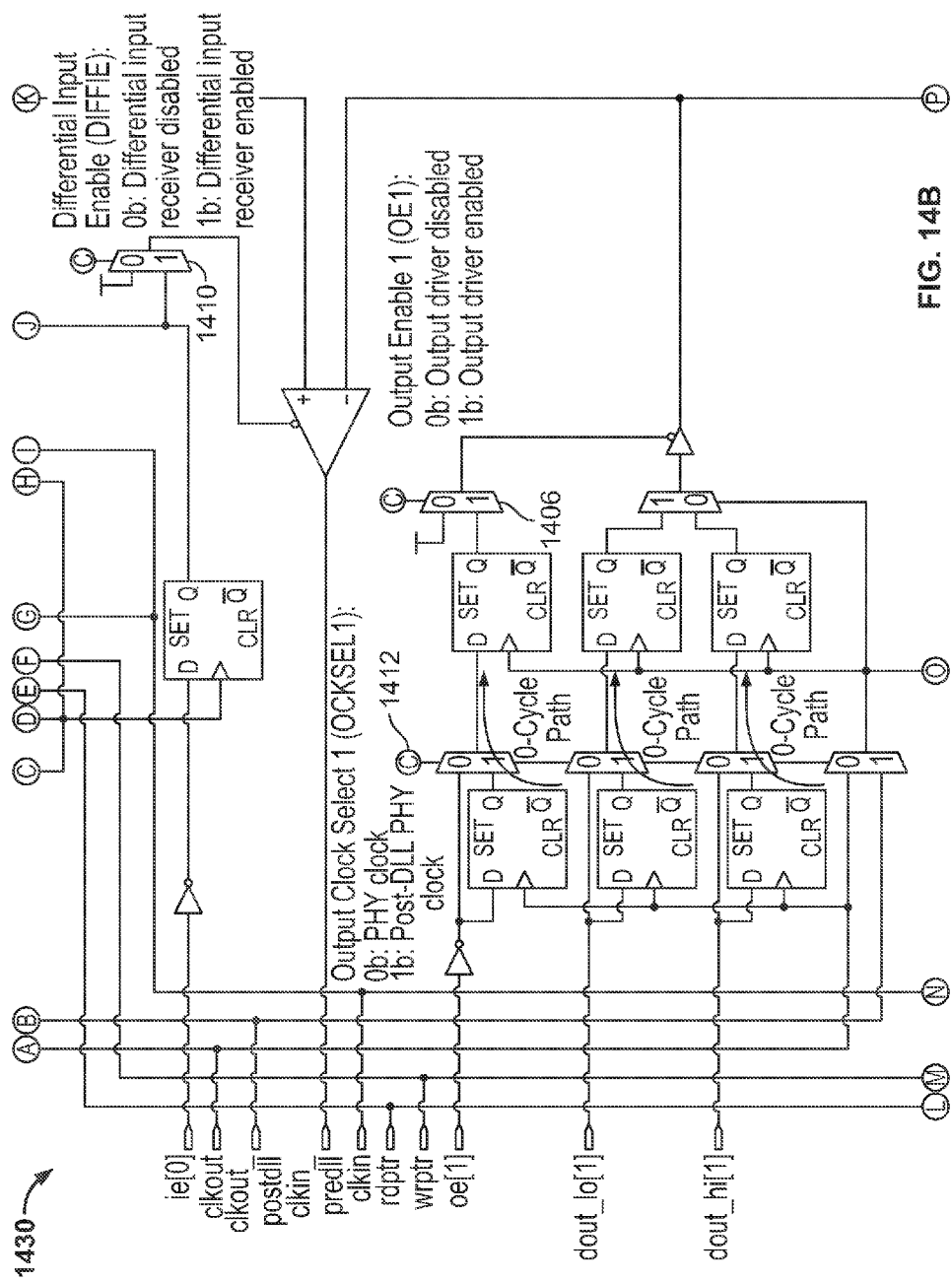
Figure 14C:
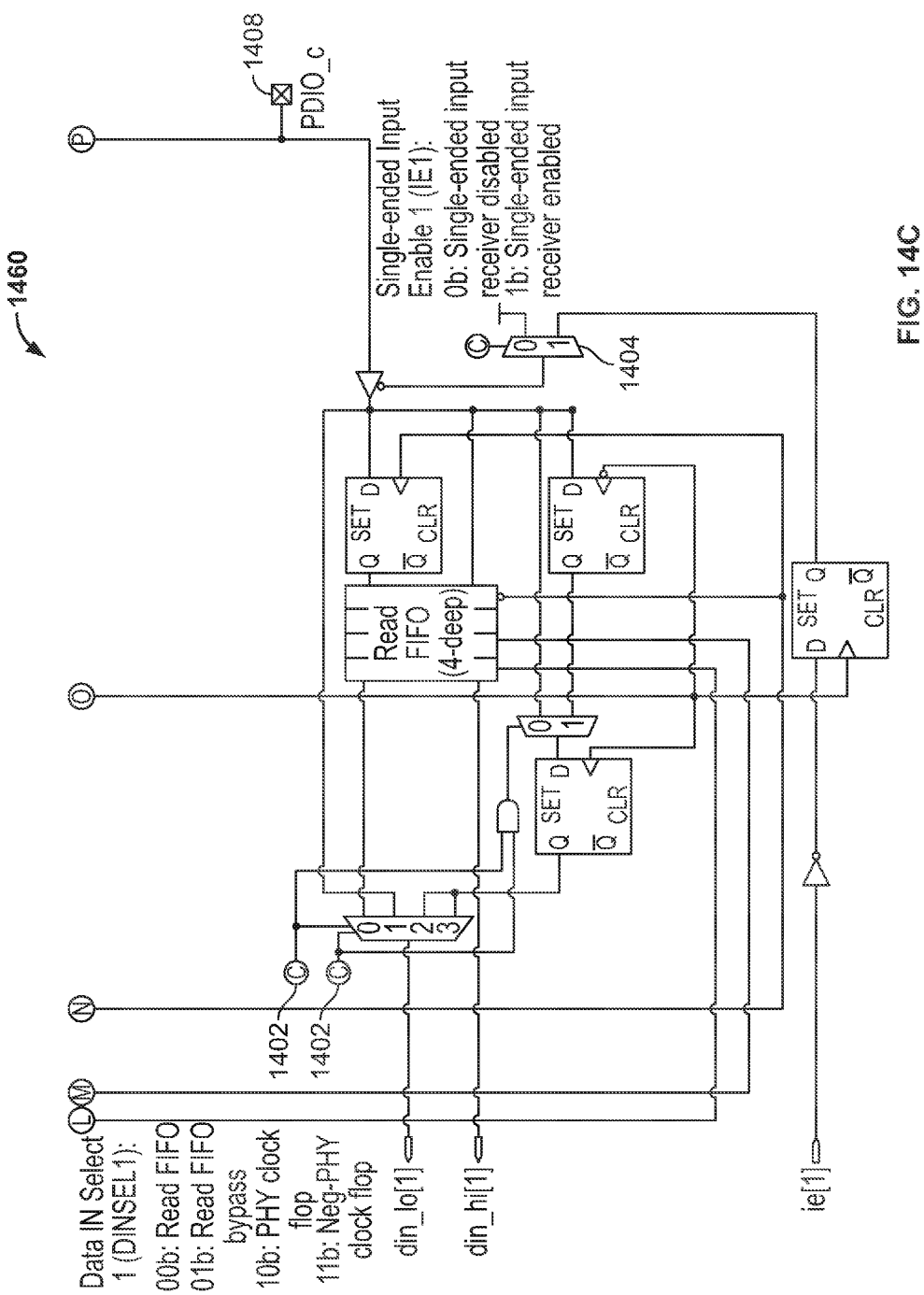

FIG. 14 is an illustrative logical representation of a PDIO according to certain embodiments. In the embodiment shown, PDIO 1400 is disposed within a 48-IO module. Each PDIO may be viewed logically as including two PSIO with additional shared resources allowing it to be configured as either a single differential I/O buffer or two single-ended I/O buffers. In other embodiments, the exact implementation of the PDIO may differ from this representation but the main functionality and programmability is shown here is preserved. PDIO 1400 includes one or more of programmability options, configurability options, and IOCSR options (more details provided in Table 5 below). OE bits 1406, OE0 and OE1, may statically enable/disable the output driver. When enabled, the dynamic control of the output enable is from the "oe" signal (signal 1506 in FIG. 15). IE bits 1404, IE0 and IE1, may statically enable/disable the input receiver. When enabled, the dynamic control of the input enable is from the "ie" signal (signal 1504 in FIG. 15). DINSEL bits 1402, DINSEL0 and DINSEL1, may statically select the sources for the input data (corresponding to signals 1502 in FIG. 15). The input data may be sourced from the read FIFO, directly from the input (bypassing the read FIFO), sampled on the positive edge of the output clock, or sampled on the negative edge of the output clock (e.g., staged on the rising edge of the output clock to enable a full cycle timing from the pipelines to the core).

Output Clock Select (OCKSEL) bits 1412, OCKSEL0 and OCKSEL1, may statically select the output clock source. The output clock may be sourced from either the pre-DLL PHY clock or the post-DLL PHY clock. Sourcing the output clock from the post-DLL PHY clock may allow for the output of the PDIO to be delayed by the shared DLL. For example, this approach can typically be used to delay either the clock or strobe signals on the interface. Differential Input Enable (DIFFIE) bit 1410 may statically enable/disable the differential input receiver. When enabled, the dynamic control of the input enable is from the "ie[0]" signal (signal 1504 in FIG. 15). The differential receiver does not have any synchronization logic as the received differential signal is expected to either be a clock or strobe signal.

Figure 15A:
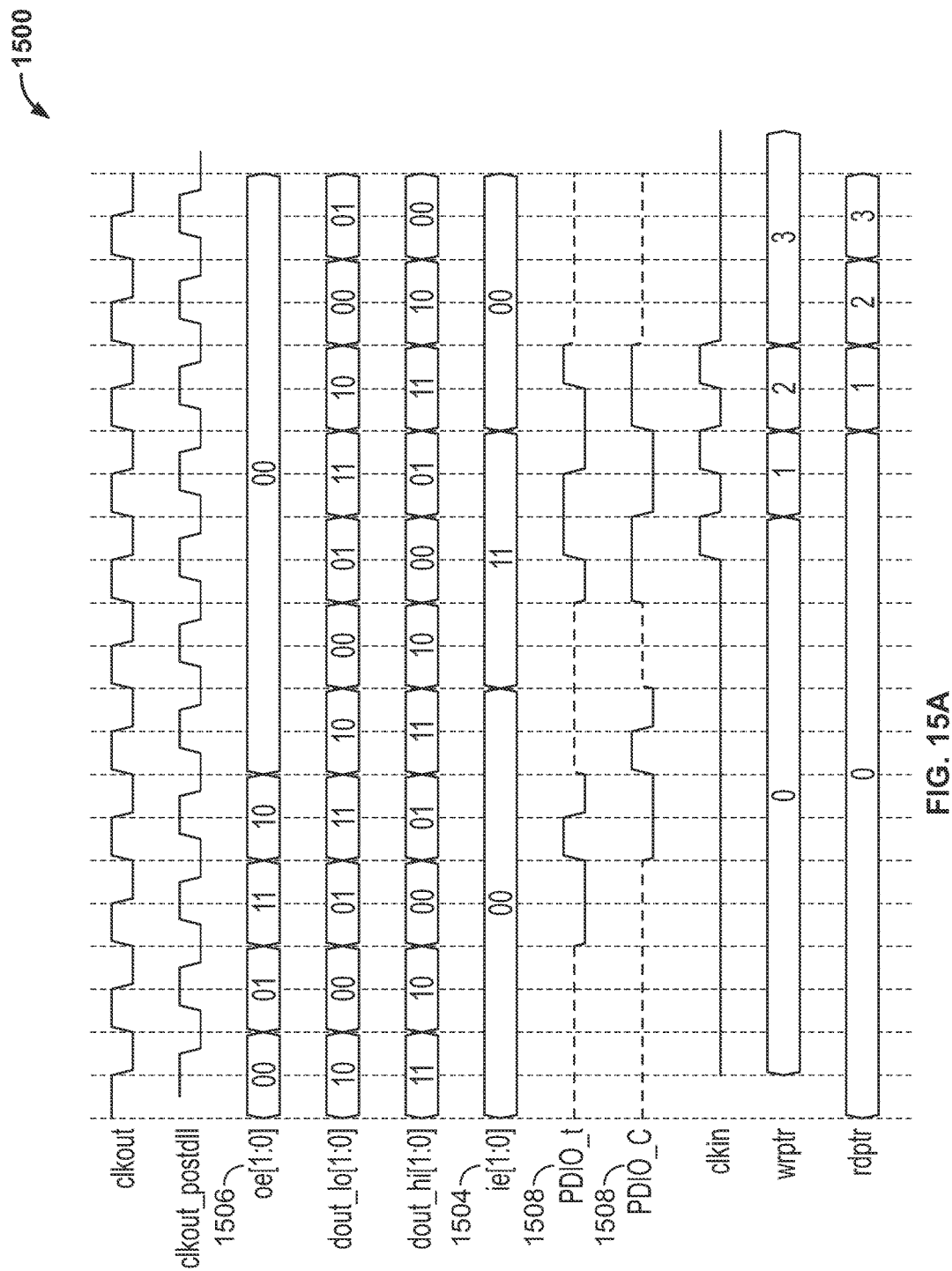
FIGS. 15A and 15B (hereinafter collectively referred to as FIG. 15) depict an illustrative timing diagram of a PDIO according to certain embodiments.
Figure 15B:
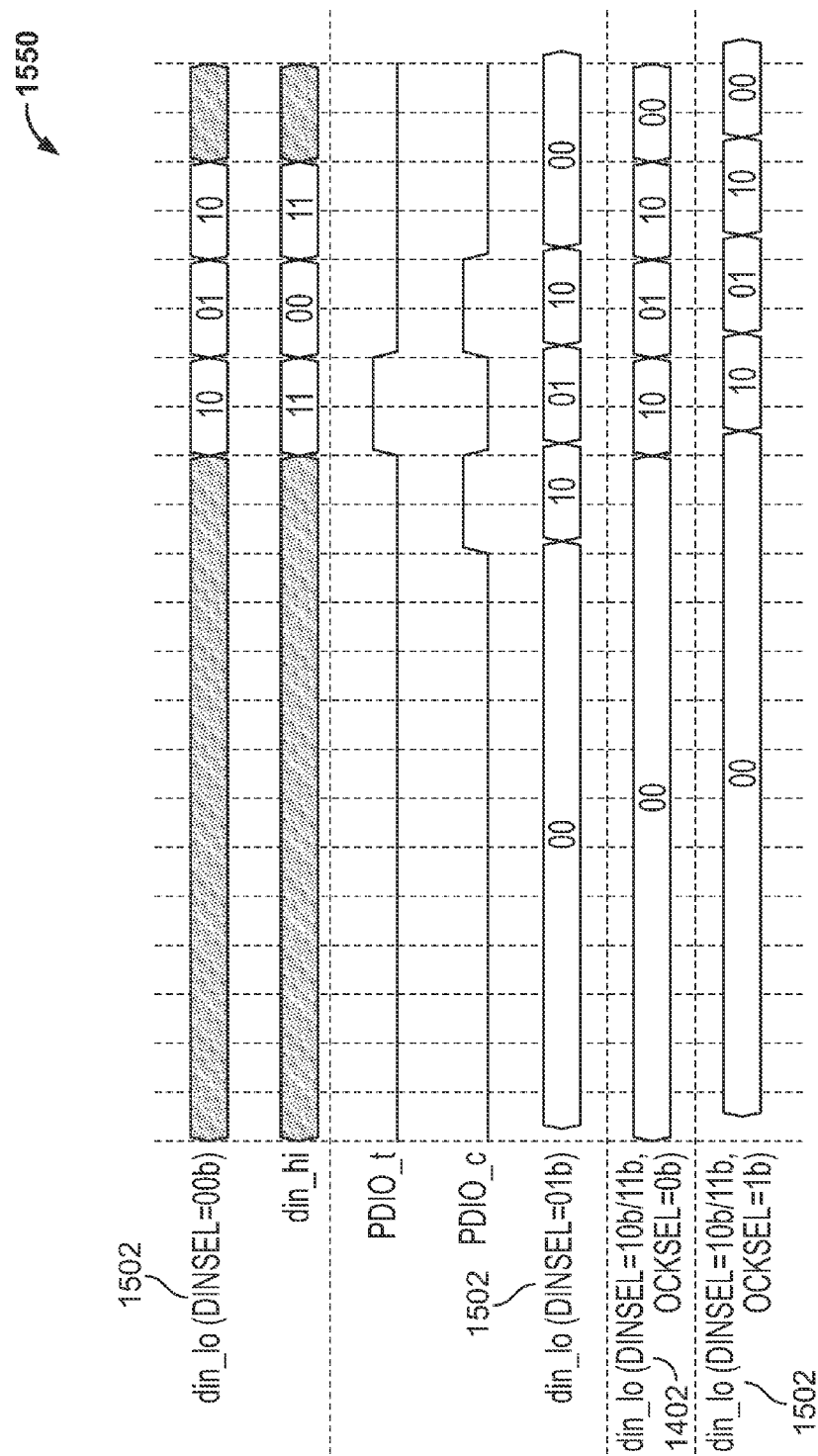

FIG. 15 is an illustrative timing diagram of a PDIO according to certain embodiments. For example, FIG. 15 shows a timing diagram 1500 of how PDIO 1400 behaves based on the various controls as configured according to Table 5 below. For example, if the configuration bits are set as OE=0, IE=0, DINSEL=XX, OCKSEL=X, and DIFFIE=1, PDIO outputs 1408 are expected to be differential in nature. PDIO outputs 1408/1508 are further expected to map to differential input strobes (e.g., RDQS_t/RDQS_c). In another example, if the configuration bits are set as OE=0, IE=1, DINSEL=10, OCKSEL=X, and DIFFIE=0, either or both PDIO outputs 1408 are expected to be single ended and input data is expected to be synchronous to the rising edge of the output clock. PDIO outputs 1408/1508 are further expected to map to SDR input signals (e.g., DERR for HBM DRAM). The various PDIO configurations expected based on the configuration bits are shown below in Table 5. These configuration bits may be provided using programmable logic or circuitry, such as an FPGA. Unused configurations are indicated with asterisks (*).

TABLE 5

Expected PDIO Configurations

| Configuration | | | | | | |
|---|---|---|---|---|---|---|
| OE | IE | DINSEL | OCKSEL | DIFFIE | IO | Comments |
| 0 | 0 | XX | X | 0 | TRI-STATE | PDIO_t/PDIO_c is disabled and unused. Clocks to the PDIO can be gated and powered down. Expected to map to all unused PDIO buffers. |
| 0 | 0 | XX | X | 1 | DIFF INPUT | PDIO_t/PDIO_c input is expected to be differential in nature. Expected to map to differential input strobes (e.g. RDQS_t/RDQS_c). |
| 0* | 1* | 00* | X* | 0* | SE INPUT | PDIO_t and/or PDIO_c are expected to be single ended and source-synchronous to the input clock (clkin). Data is sampled with clkin and stored into the read FIFO to be drained by the core control. No expected mappings to both QDR WIO SRAM and HBM DRAM. |
| 0* | 1* | 01* | X* | 0* | SE INPUT | PDIO_t and/or PDIO_c are expected to be single ended and input data is expected to be asynchronous to any clocks within the subsystem. No expected mappings to both QDR WIO SRAM and HBM DRAM. |
| 0 | 1 | 10 | X | 0 | SE INPUT | PDIO_t and/or PDIO_c are expected to be single ended and input data is expected to be synchronous to the rising edge of the output clock. Expected to map to SDR input signals (e.g. DERR for HBM DRAM). |
| 0 | 1 | 11 | X | 0 | SE INPUT | PDIO_t and/or PDIO_c are expected to be single ended and input data is expected to be synchronous to the falling edge of the output clock. Expected to map to SDR input signals (e.g. DERR for HBM DRAM). |
| 1 | 0 | XX | 0 | 0 | DIFF/SE OUTPUT | PDIO_t/PDIO_c output is expected to be either differential or single-ended and synchronous to the rising edge of the output clock. Expected to map to SDR/DDR output signals (e.g. A for QDR WIO SRAM and CKE for HBM DRAM). |
| 1 | 0 | XX | 1 | 0 | DIFF/SE OUTPUT | PDIO_t/PDIO_c output is expected to be either differential or single-ended and synchronous to the rising edge of the DLL delayed output clock. Expected to map to differential output clock and strobes (e.g. CK_t/CK_c, WDQS_t/WDQS_c). |
| 1* | 0* | XX* | 1* | 1* | DIFF INOUT | PDIO_t/PDIO_c is expected to be differential in nature. No expected mappings to both QDR WIO SRAM and HBM DRAM. |
| 1 | 1 | 00 | 0 | 0 | SE INOUT | PDIO_t and PDIO_c output and input are expected to be synchronous to the rising edge of the output clock and rising edge of the input clock respectively. Expected to map to source-synchronous I/O signals (e.g. DQ for QDR WIO SRAM and PAR for HBM DRAM). |
| 1* | 1* | 01* | 0* | 0* | SE INOUT | PDIO_t and PDIO_c output are expected to be synchronous to the rising edge of the output clock and PSIO input is expected to be asynchronous to any clocks within the subsystem. No expected mappings to both QDR WIO SRAM and HBM DRAM. |
| 1* | 1* | 10* | 0* | 0* | SE INOUT | PDIO_t and PDIO_c output and input are expected to be synchronous to the rising edge of the output clock. No expected mappings to both QDR WIO SRAM and HBM DRAM. |
| 1* | 1* | 11* | 0* | 0* | SE INOUT | PDIO_t and PDIO_c output and input data are expected to be synchronous to the rising edge of the output clock and the falling edge of the output clock respectively. No expected mappings to both QDR WIO SRAM and HBM DRAM. |
| 1* | 1* | 00* | 1* | 0* | SE INOUT | PDIO_t and PDIO_c output and input are expected to be synchronous to the rising edge of the DLL delayed output clock and rising edge of the input clock respectively. Expected to map to source-synchronous I/O signals (e.g. DQ for QDR WIO SRAM and PAR for HBM DRAM). |
| 1* | 1* | 01* | 1* | 0* | SE INOUT | PDIO_t and PDIO_c output are expected to be synchronous to the rising edge of the DLL delayed output clock and PSIO input is expected to be asynchronous to any clocks within the subsystem. No expected mappings to both QDR WIO SRAM and HBM DRAM. |
| 1* | 1* | 10* | 1* | 0* | SE INOUT | PDIO_t and PDIO_c output and input are expected to be synchronous to the rising edge of the DLL delayed output clock. No expected mappings to both QDR WIO SRAM and HBM DRAM. |
| 1* | 1* | 11* | 1* | 0* | SE INOUT | PDIO_t and PDIO_c output and input data are expected to be synchronous to the rising edge of the output clock and the falling edge of the DLL delayed output clock respectively. No expected mappings to both QDR WIO SRAM and HBM DRAM. |
| X* | 1* | XX* | X* | 1* | INVALID | Invalid configuration as PDIO cannot be both single-ended and differential. |

The PHY interface is the communication interface between the memory controller and the PHY as illustrated in FIGS. 1-3. In embodiments concerned with QDR WIO SRAM or HBM DRAM, the PHY interface is a variation of the DDR PHY Interface (DFI). The DFI-variant PHY interface is referred to as Universal PHY Interface (UFI) for the remainder of this disclosure. Such variations in the context of the UFI described below will remain within the scope of this disclosure.

The UFI defines the signals, timing parameters, and programmable parameters required to transfer control information and data over the UFI between the MC and the PHY. UFI applies to QDR WIO SRAM, HBM DRAM, and other suitable memory. UFI defines interface groups including control and status, data, mid-stack, and sideband. The control and status interface drives the address, command, and control signals to the memory devices and receives signaling errors from the memory devices. The data interface is used to send write data and receive read data across UFI. The mid-stack interface drives reset and testability signals to the memory devices and receives temperature information from the memory devices. The sideband interface acts as the bridge to the PHY internal configuration registers.

Both the single-ended and differential interface groups may function according to the same interface protocol and timing but differ in terms of the signal widths and number of independent I/Os that they interface to. Each interface may have control/data signals including output driver enable signal (ufi_{s|d}dout{x}_en), output data signal (ufi_{s|d}dout{x}), input receiver enable signal (ufi_{s|d}din{x}_en), input data read enable signal (ufi_{s|d}din{x}_rden), and input data signal (ufi_{s|d}din{x}). FIG. 15 shows an example timing diagram for a 48-IO interface using these signals. Table 6 summarizes the UFI control and status signal mappings to QDR WIO SRAM and HBM DRAM memory devices. Table 7 summarizes the UFI data signal mappings to QDR WIO SRAM and HBM DRAM memory devices.

The output driver enable signal may enable the output driver of the single-ended or differential I/O buffer. The output data signal may include a data value to be driven on the pins of the single-ended or differential I/O buffer. The bus width may be double that of the number of I/O buffers in that group to support double-data-rate (e.g., for an I/O group of Y, IO[Z] is driven with ufi_{s|d}dout{x}[Z] in phase 0 and ufi_{s|d}dout{x}[Z+Y] in phase 1). The input receiver enable signal may enable the input receiver of the single-ended or differential I/O buffer. The input data read enable signal may have control to drain the read FIFO, i.e., advancing the read pointer for the I/O group. If there are dummy read pulses, this signal needs to be asserted to additionally drain the data from FIFO entries due to the dummy read pulses. The input data signal may include a data value from the receiver either from the read FIFO, sampled by the PHY clock (rising/falling edge), or bypassed from the pin input.

Figure 16A:
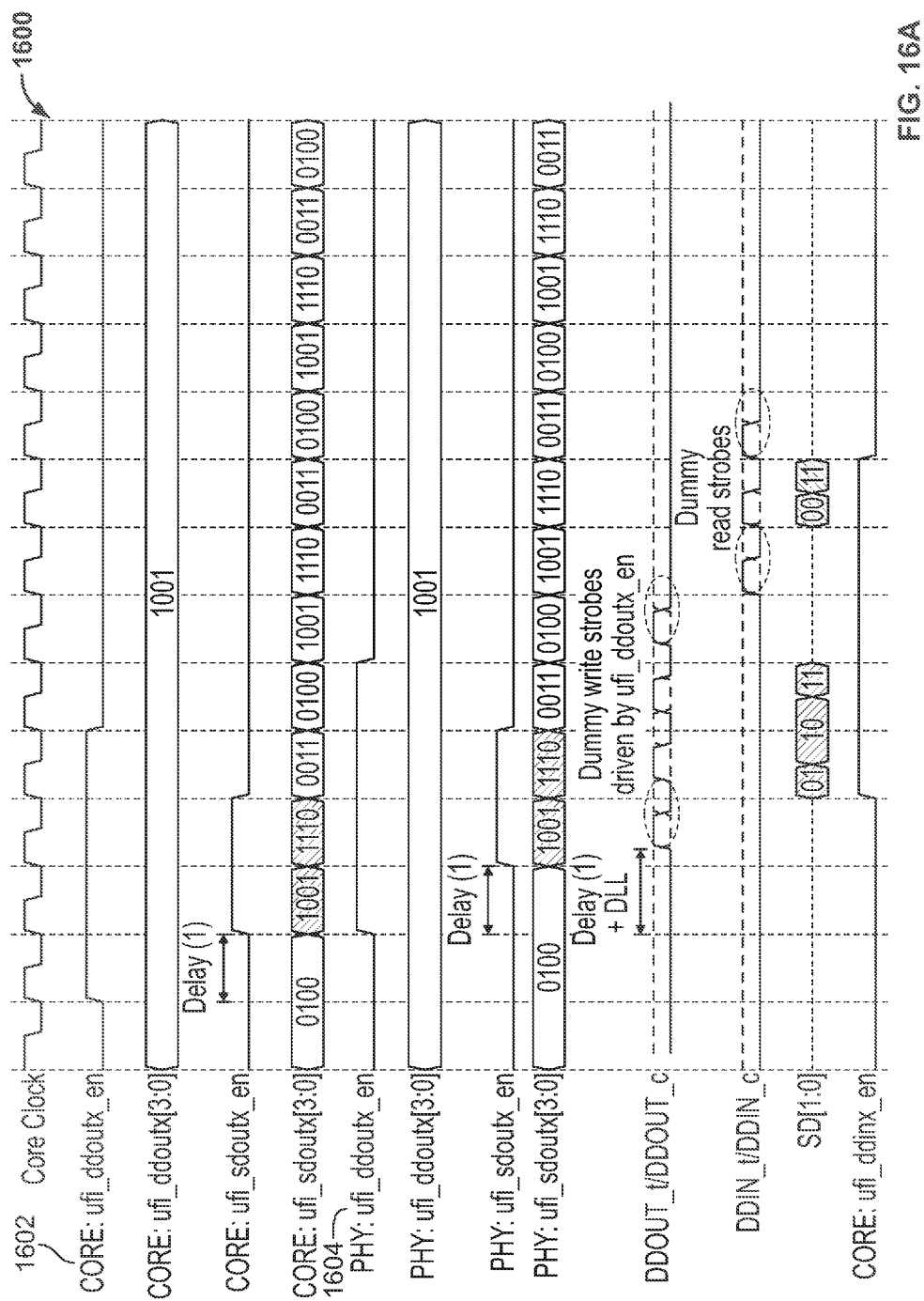
FIGS. 16A and 16B (hereinafter collectively referred to as FIG. 16) depict an illustrative timing diagram of an interface block including 48-IO modules according to certain embodiments.
Figure 16B:
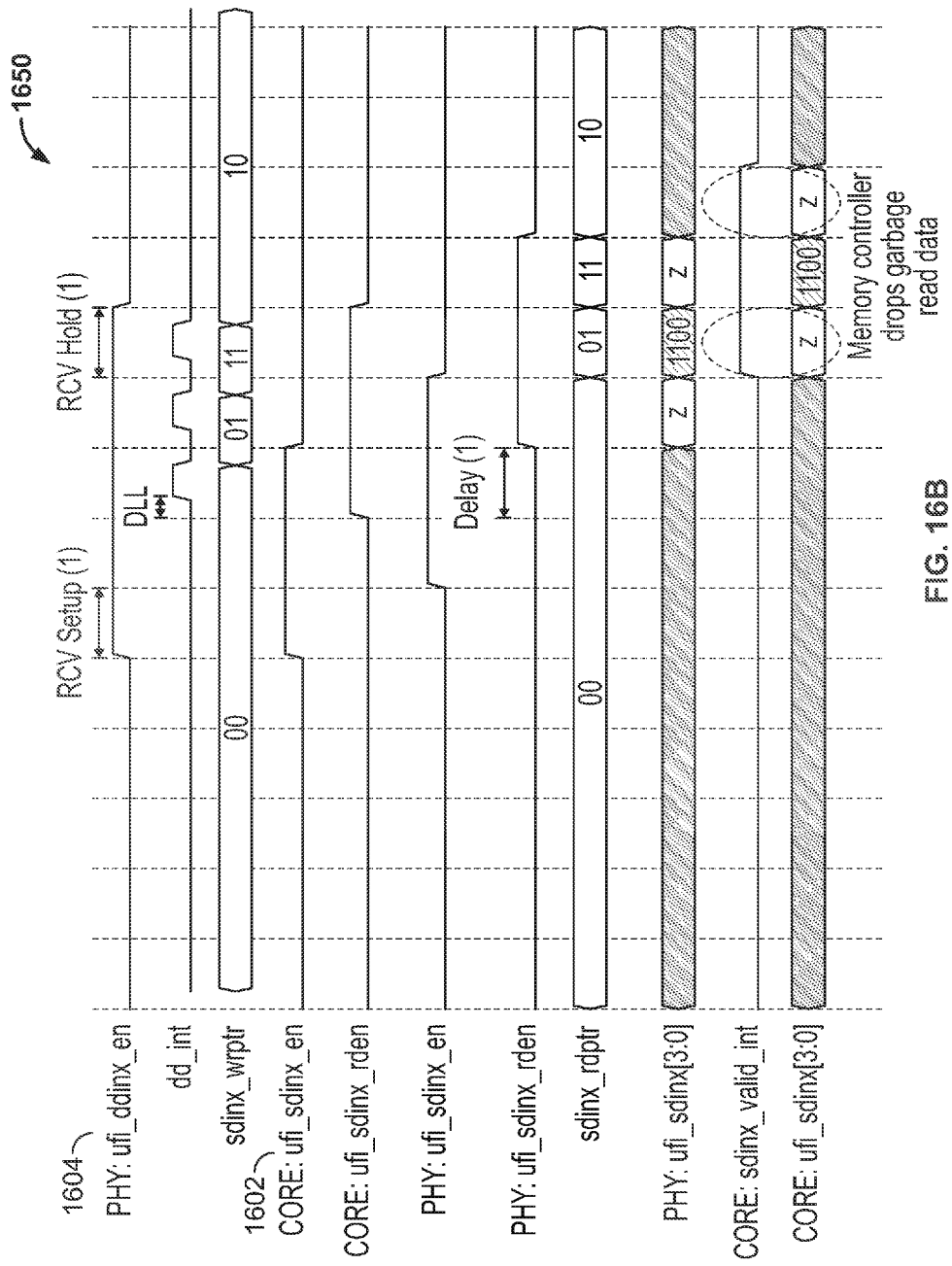

FIG. 16 is an illustrative timing diagram 1600 of an interface block including 48-IO modules according to certain embodiments. In the embodiment shown, a one pipe stage delay is assumed for the interface block. The notation of "CORE" in, e.g., signals 1602, refers to the timing after the final flops in the MC (implemented in the core fabric) while the notation of "PHY," e.g., in signals 1604, refers to the timing at the PHY interface after the interface block pipe stages. The interface block may also allow for multiple logical pipelines to be inserted between the MC and the PHY for longer routes to achieve the desired frequency at the expense of extra latency. In some embodiments, this is a fundamental requirement of the interface to limit the number of signals that crosses between the MC and the PHY. The timing diagram in FIG. 16 shows an example of one pipeline inserted in between the MC and the PHY. The addition of pipelines in between the MC and the PHY may be accounted for by the control logic in the MC.

The UFI control and status interface handles the transmission of signals required to drive the address, command, and control signals to the memory devices. It also receives error indications for the memory devices. The outgoing signals are passed to the memory devices in a manner that maintains the timing relationship among the signals on the UFI. All signals on the outgoing control interface are assumed to be double-data-rate, i.e., both the high and low phases of the clock communicate different attributes. In some embodiments, single-data-rate signals are driven with the same assumptions but the same attribute is driven for both the high and low phase of the clock. The incoming signals communicate status/error from the memory device. All signals on the incoming status interface are assumed to be single-data-rate and may be synchronized to the PHY clock before they are routed back to the core fabric. Table 6 below summarizes these UFI control and status signal mappings to QDR WIO SRAM and HBM DRAM memory devices.

TABLE 6

UFI Control and Status Signal Mapping

| 48-IO Module Signal | IO | QDR WIO SRAM Channel x/y | HBM DRAM Channel x/y |
|---|---|---|---|
| ufi_sdout0_en | C→P | ufi_chx_en | ufi_chx_en |
| ufi_sdout0[39:0] | C→P | {1'b0, ufi_cfgx, 1'b0, ufi_rwx_n, ufi_ldx_n, ufi_ax_p1[11], ufi_ax_p1[12], ufi_ax_p1[19], ufi_ax_p1[10], 2'b00, ufi_ax_p1[7], ufi_ax_p1[8], ufi_ax_p1[5], ufi_ax_p1[6], ufi_ax_p1[3:0], 2'b00, ufi_cfgx, 1'b0, ufi_rwx_n, ufi_ldx_n, ufi_ax_p0[11], ufi_ax_p0[12], ufi_ax_p0[19], ufi_ax_p0[10], 2'b00, ufi_ax_p0[7], ufi_ax_p0[8], ufi_ax_p0[5], ufi_ax_p0[6], ufi_ax_p0[3:0], 1'b0} | {3'b000, ufi_rx_p1[5:0], 2'b00, ufi_cx_p1[7:0], 4'b0000, ufi_rx_p0[5:0], 2'b00, ufi_cx_p0[7:0], 1'b0} |
| ufi_sdin0_en | C→P | ufi_chx_en | ufi_chx_en |
| ufi_sdin0_rden | C→P | 1'b0 | 1'b0 |
| ufi_sdin0[39:0] | P→C | {ufi_sdin0_nc[39:18], ufi_errx_n, ufi_sdin0_nc[16:0]} | {ufi_sdin0_nc[39:20], ufi_aerrx_n, ufi_sdin0_nc[18:0]} |
| ufi_ddout0_en[1:0] | C→P | {1'b0, ufi_chx_en} | {ufi_chx_en, 1'b0} |
| ufi_ddout0[3:0] | C→P | {1'b0, ufi_ax_p1[4], 1'b0, ufi_ax_p0[4]} | {ufi_ckex, 1'b0, ufi_ckex, 1'b0} |
| ufi_ddin0_en[1:0] | C→P | 2'b00 | 2'b00 |
| ufi_ddin0_rden | C→P | 1'b0 | 1'b0 |
| ufi_ddin0[3:0] | P→C | {ufi_ddin0_nc[3:0]} | {ufi_ddin0_nc[3:0]} |
| ufi_ddout1_en[1:0] | C→P | {ufi_chx_en, ufi_chx_en} | {ufi_chx_en, ufi_chx_en} |
| ufi_ddout1[3:0] | C→P | 4'b1001 | 4'b1001 |
| ufi_ddin1_en[1:0] | C→P | 2'b00 | 2'b00 |
| ufi_ddin1_rden | C→P | 1'b0 | 1'b0 |
| ufi_ddin1[3:0] | P→C | {ufi_ddin1_nc[3:0]} | {ufi_ddin1_nc[3:0]} |
| ufi_ddout2_en[1:0] | C→P | {1'b0, ufi_chy_en} | {ufi_chy_en, 1'b0} |
| ufi_ddout2[3:0] | C→P | {1'b0, ufi_ay_p1[4], 1'b0, ufi_ay_p0[4]} | {ufi_ckey, 1'b0, ufi_ckey, 1'b0} |
| ufi_ddin2_en[1:0] | C→P | 2'b00 | 2'b00 |
| ufi_ddin2_rden | C→P | 1'b0 | 1'b0 |
| ufi_ddin2[3:0] | P→C | {ufi_ddin2_nc[3:0]} | {ufi_ddin2_nc[3:0]} |

TABLE 6-continued

UFI Control and Status Signal Mapping

| 48-IO Module Signal | IO | QDR WIO SRAM Channel x/y | HBM DRAM Channel x/y |
|---|---|---|---|
| ufi_ddout3_en[1:0] | C→P | {ufi_chy_en, ufi_chy_en} | {ufi_chy_en, ufi_chy_en} |
| ufi_ddout3[3:0] | C→P | 4'b1001 | 4'b1001 |
| ufi_ddin3_en[1:0] | C→P | 2'b00 | 2'b00 |
| ufi_ddin3_rden | C→P | 1'b0 | 1'b0 |
| ufi_ddin3[3:0] | P→C | {ufi_ddin3_nc[3:0]} | {ufi_ddin3_nc[3:0]} |
| ufi_sdout1_en | C→P | ufi_chy_en | ufi_chy_en |
| ufi_sdout1[39:0] | C→P | {1'b0, ufi_cfgy, 1'b0, ufi_rwy_n, ufi_ldy_n, ufi_ay_p1[11], ufi_ay_p1[12], ufi_ay_p1[19], ufi_ay_p1[10], 2'b00, ufi_ay_p1[7], ufi_ay_p1[8], ufi_ay_p1[5], ufi_ay_p1[6], ufi_ay_p1[3:0], 2'b00, ufi_cfgy, 1'b0, ufi_rwy_n, ufi_ldy_n, ufi_ay_p0[11], ufi_ay_p0[12], ufi_ay_p0[19], ufi_ay_p0[10], 2'b00, ufi_ay_p0[7], ufi_ay_p0[8], ufi_ay_p0[5], ufi_ay_p0[6], ufi_ay_p0[3:0], 1'b0} | {3'b000, ufi_rx_p1[5:0], 2'b00, ufi_cx_p1[7:0], 4'b0000, ufi_rx_p0[5:0], 2'b00, ufi_cx_p0[7:0], 1'b0} |
| ufi_sdin1_en | C→P | ufi_chy_en | ufi_chy_en |
| ufi_sdin1_rden | C→P | 1'b0 | 1'b0 |
| ufi_sdin1[39:0] | P→C | {ufi_sdin1_nc[39:18], ufi_erry_n, ufi_sdin1_nc[16:0]} | {ufi_sdin1_nc[39:18], ufi_erry_n, ufi_sdin1_nc[16:0]} |

The data interface handles the transmission of write data and the capture/return of read data across the UFI. The signals are passed to the memory devices in a manner that maintains the timing relationship among the signals on the UFI similar to the control and status interface. All signals on the data interface are assumed to be double-data-rate, i.e., both the high and low phases of the clock communicate different attributes. In some embodiments, single-data-rate signals are driven with the same assumptions but the same attribute is driven for both the high and low phase of the clock. Table 7 summarizes these UFI data signal mappings to QDR WIO SRAM and HBM DRAM memory devices.

TABLE 7

UFI Data Signal Mapping

| 48-IO Module Signal | IO | QDR WIO SRAM Channel x | HBM DRAM Channel x | | | |
|---|---|---|---|---|---|---|
| | | | DWORD0 | DWORD1 | DWORD2 | DWORD3 |
| ufi_sdout0_en | C→P | ufi_wdqx_en | ufi_wdqx_en | ufi_wdqx_en | ufi_wdqx_en | ufi_wdqx_en |
| ufi_sdout0[39:0] | C→P | {ufi_wdbix_p1[1], ufi_wdqx_p1[15:8], ufi_wcbx_p1[1], ufi_wdbix_p1[0], ufi_wdqx_p1[7:0], ufi_wcbx_p1[0], ufi_wdbix_p0[1], ufi_wdqx_p0[15:8], ufi_wcbx_p0[1], ufi_wdbix_p0[0], ufi_wdqx_p0[7:0], ufi_wcbx_p0[0]} | {ufi_wdbix_p1[1], ufi_wdqx_p1[15:8], ufi_wcbx_p1[1], ufi_wdbix_p1[0], ufi_wdqx_p1[7:0], ufi_wcbx_p1[0], ufi_wdbix_p0[1], ufi_wdqx_p0[15:8], ufi_wcbx_p0[1], ufi_wdbix_p0[0], ufi_wdqx_p0[7:0], ufi_wcbx_p0[0]} | {ufi_wdbix_p1[5], ufi_wdqx_p1[47:40], ufi_wcbx_p1[5], ufi_wdbix_p1[4], ufi_wdqx_p1[39:32], ufi_wcbx_p1[4], ufi_wdbix_p0[5], ufi_wdqx_p0[47:40], ufi_wcbx_p0[5], ufi_wdbix_p0[4], ufi_wdqx_p0[39:32], ufi_wcbx_p0[4]} | {ufi_wdbix_p1[9], ufi_wdqx_p1[79:72], ufi_wcbx_p1[9], ufi_wdbix_p1[8], ufi_wdqx_p1[71:64], ufi_wcbx_p1[8], ufi_wdbix_p0[9], ufi_wdqx_p0[79:72], ufi_wcbx_p0[9], ufi_wdbix_p0[8], ufi_wdqx_p0[71:64], ufi_wcbx_p0[8]} | {ufi_wdbix_p1[13], ufi_wdqx_p1[111:104], ufi_wcbx_p1[13], ufi_wdbix_p1[12], ufi_wdqx_p1[103:96], ufi_wcbx_p1[12], ufi_wdbix_p0[13], ufi_wdqx_p0[111:104], ufi_wcbx_p0[13], ufi_wdbix_p0[12], ufi_wdqx_p0[103:96], ufi_wcbx_p0[12]} |
| ufi_sdin0_en | C→P | ufi_rdqx_en | ufi_rdqx_en | ufi_rdqx_en | ufi_rdqx_en | ufi_rdqx_en |
| ufi_sdin0_rden | C→P | ufi_rdqx_rden | ufi_rdqx_rden | ufi_rdqx_rden | ufi_rdqx_rden | ufi_rdqx_rden |
| ufi_sdin0[39:0] | P→C | {ufi_rdbix_p1[1], ufi_rdqx_p1[15:8], ufi_rcbx_p1[1], ufi_rdbix_p1[0], ufi_rdqx_p1[7:0], ufi_rcbx_p1[0], ufi_rdbix_p0[1], ufi_rdqx_p0[15:8], ufi_rcbx_p0[1], ufi_rdbix_p0[0], ufi_rdqx_p0[7:0], ufi_rcbx_p0[0]} | {ufi_rdbix_p1[1], ufi_rdqx_p1[15:8], ufi_rcbx_p1[1], ufi_rdbix_p1[0], ufi_rdqx_p1[7:0], ufi_rcbx_p1[0], ufi_rdbix_p0[1], ufi_rdqx_p0[15:8], ufi_rcbx_p0[1], ufi_rdbix_p0[0], ufi_rdqx_p0[7:0], ufi_rcbx_p0[0]} | {ufi_rdbix_p1[5], ufi_rdqx_p1[47:40], ufi_rcbx_p1[5], ufi_rdbix_p1[4], ufi_rdqx_p1[39:32], ufi_rcbx_p1[4], ufi_rdbix_p0[5], ufi_rdqx_p0[47:40], ufi_rcbx_p0[5], ufi_rdbix_p0[4], ufi_rdqx_p0[39:32], ufi_rcbx_p0[4]} | {ufi_rdbix_p1[9], ufi_rdqx_p1[79:72], ufi_rcbx_p1[9], ufi_rdbix_p1[8], ufi_rdqx_p1[71:64], ufi_rcbx_p1[8], ufi_rdbix_p0[9], ufi_rdqx_p0[79:72], ufi_rcbx_p0[9], ufi_rdbix_p0[8], ufi_rdqx_p0[71:64], ufi_rcbx_p0[8]} | {ufi_rdbix_p1[13], ufi_rdqx_p1[111:104], ufi_rcbx_p1[13], ufi_rdbix_p1[12], ufi_rdqx_p1[103:96], ufi_rcbx_p1[12], ufi_rdbix_p0[13], ufi_rdqx_p0[111:104], ufi_rcbx_p0[13], ufi_rdbix_p0[12], ufi_rdqx_p0[103:96], ufi_rcbx_p0[12]} |
| ufi_ddout0_en[1:0] | C→P | 2'b00 | {ufi_wparx_en, 1'b0} | {ufi_wparx_en, 1'b0} | {ufi_wparx_en, 1'b0} | {ufi_wparx_en, 1'b0} |
| ufi_ddout0[3:0] | C→P | 4'b0000 | {ufi_wparx_p1[0], 1'b0, ufi_wparx_p0[0], 1'b0} | {ufi_wparx_p1[1], 1'b0, ufi_wparx_p0[1], 1'b0} | {ufi_wparx_p1[2], 1'b0, ufi_wparx_p0[2], 1'b0} | {ufi_wparx_p1[3], 1'b0, ufi_wparx_p0[3], 1'b0} |
| ufi_ddin0_en[1:0] | C→P | 2'b00 | {ufi_rparx_en, 1'b0} | {ufi_rparx_en, 1'b0} | {ufi_rparx_en, 1'b0} | {ufi_rparx_en, 1'b0} |

TABLE 7-continued

UFI Data Signal Mapping

| 48-IO | | QDR WIO SRAM | HBM DRAM Channel x | | | |
|---|---|---|---|---|---|---|
| Module Signal | IO | Channel x | DWORD0 | DWORD1 | DWORD2 | DWORD3 |
| ufi_ddin0_rden | C→P | 1'b0 | ufi_rparx_rden | ufi_rparx_rden | ufi_rparx_rden | ufi_rparx_rden |
| ufi_ddin0[3:0] | P→C | ufi_ddin0_nc[3:0] | {ufi_rparx_p1[0], ufi_ddin0_nc[2], ufi_rparx_p0[0], ufi_ddin0_nc[0]} | {ufi_rparx_p1[1], ufi_ddin0_nc[2], ufi_rparx_p0[1], ufi_ddin0_nc[0]} | {ufi_rparx_p1[2], ufi_ddin0_nc[2], ufi_rparx_p0[2], ufi_ddin0_nc[0]} | {ufi_rparx_p1[3], ufi_ddin0_nc[2], ufi_rparx_p0[3], ufi_ddin0_nc[0]} |
| ufi_ddout1_en[1:0] | C→P | {ufi_wdqsx_en, ufi_wdqsx_en} | {ufi_wdqsx_en, ufi_wdqsx_en} | {ufi_wdqsx_en, ufi_wdqsx_en} | {ufi_wdqsx_en, ufi_wdqsx_en} | {ufi_wdqsx_en, ufi_wdqsx_en} |
| ufi_ddout1[3:0] | C→P | 4'b1001 | 4'b1001 | 4'b1001 | 4'b1001 | 4'b1001 |
| ufi_ddin1_en[1:0] | C→P | 2'b00 | 2'b00 | 2'b00 | 2'b00 | 2'b00 |
| ufi_ddin1_rden | C→P | 1'b0 | 1'b0 | 1'b0 | 1'b0 | 1'b0 |
| ufi_ddin1[3:0] | P→C | {ufi_ddin1_nc[3:0]} | {ufi_ddin1_nc[3:0]} | {ufi_ddin1_nc[3:0]} | {ufi_ddin1_nc[3:0]} | {ufi_ddin1_nc[3:0]} |
| ufi_ddout2_en[1:0] | C→P | {1'b0, ufi_wdqx_en} | 2'b00 | 2'b00 | 2'b00 | 2'b00 |
| ufi_ddout2[3:0] | C→P | {1'b0, ufi_wdqx_p1[28], 1'b0, ufi_wdqx_p0[28]} | 4'b0000 | 4'b0000 | 4'b0000 | 4'b0000 |
| ufi_ddin2_en[1:0] | C→P | {1'b0, ufi_rdqx_en} | 2'b11 | 2'b11 | 2'b11 | 2'b11 |
| ufi_ddin2_rden | C→P | ufi_rdqx_rden | 1'b0 | 1'b0 | 1'b0 | 1'b0 |
| ufi_ddin2[3:0] | P→C | {ufi_ddin2_nc[3], ufi_rdqx_p1[28], ufi_ddin2_nc[1], ufi_rdqx_p0[28]} | {ufi_ddin2_nc[3:0]} | {ufi_ddin2_nc[3:0]} | {ufi_ddin2_nc[3:0]} | {ufi_ddin2_nc[3:0]} |
| ufi_ddout3_en[1:0] | C→P | 2'b00 | 2'b00 | 2'b00 | 2'b00 | 2'b00 |
| ufi_ddout3[3:0] | C→P | 4'b0000 | 4'b0000 | 4'b0000 | 4'b0000 | 4'b0000 |
| ufi_ddin3_en[1:0] | C→P | 2'b11 | 2'b10 | 2'b10 | 2'b10 | 2'b10 |
| ufi_ddin3_rden | C→P | 1'b0 | 1'b0 | 1'b0 | 1'b0 | 1'b0 |
| ufi_ddin3[3:0] | P→C | {ufi_ddin3_nc[3:0]} | {ufi_derrx_p1[0], ufi_ddin3_nc[2], ufi_derrx_p0[0], ufi_ddin3_nc[0]} | {ufi_derrx_p1[1], ufi_ddin3_nc[2], ufi_derrx_p0[1], ufi_ddin3_nc[0]} | {ufi_derrx_p1[2], ufi_ddin3_nc[2], ufi_derrx_p0[2], ufi_ddin3_nc[0]} | {ufi_derrx_p1[3], ufi_ddin3_nc[2], ufi_derrx_p0[3], ufi_ddin3_nc[0]} |
| ufi_sdout1_en | C→P | ufi_wdqx_en | ufi_wdqx_en | ufi_wdqx_en | ufi_wdqx_en | ufi_wdqx_en |
| ufi_sdout1[39:0] | C→P | {1'b0, ufi_wdqx_p1[31], ufi_wdbix_p1[3], ufi_wdqx_p1[29], ufi_wdqx_p1[30], ufi_wdqx_p1[27:24], ufi_wcbx_p1[3], ufi_wdbix_p1[2], ufi_wdqx_p1[23:16], ufi_wcbx_p1[2], 1'b0, ufi_wdqx_p0[31], ufi_wdbix_p0[3], ufi_wdqx_p0[29], ufi_wdqx_p0[30], ufi_wdqx_p0[27:24], ufi_wcbx_p0[3], ufi_wdbix_p0[2], ufi_wdqx_p0[23:16], ufi_wcbx_p0[2]} | {ufi_wdbix_p1[3], ufi_wdqx_p1[31:24], ufi_wcbx_p1[3], ufi_wdbix_p1[2], ufi_wdqx_p1[23:16], ufi_wcbx_p1[2], ufi_wdbix_p0[3], ufi_wdqx_p0[31:24], ufi_wcbx_p0[3], ufi_wdbix_p0[2], ufi_wdqx_p0[23:16], ufi_wcbx_p0[2]} | {ufi_wdbix_p1[7], ufi_wdqx_p1[63:56], ufi_wcbx_p1[7], ufi_wdbix_p1[6], ufi_wdqx_p1[55:48], ufi_wcbx_p1[6], ufi_wdbix_p0[7], ufi_wdqx_p0[63:56], ufi_wcbx_p0[7], ufi_wdbix_p0[6], ufi_wdqx_p0[55:48], ufi_wcbx_p0[6]} | {ufi_wdbix_p1[11], ufi_wdqx_p1[95:88], ufi_wcbx_p1[11], ufi_wdbix_p1[10], ufi_wdqx_p1[87:80], ufi_wcbx_p1[10], ufi_wdbix_p0[11], ufi_wdqx_p0[95:88], ufi_wcbx_p0[11], ufi_wdbix_p0[10], ufi_wdqx_p0[87:80], ufi_wcbx_p0[10]} | {ufi_wdbix_p1[15], ufi_wcbx_p1[15], ufi_wdbix_p1[14], ufi_wdqx_p1[119:112], ufi_wcbx_p1[14], ufi_wdbix_p0[15], ufi_wdqx_p0[127:120], ufi_wcbx_p0[15], ufi_wdbix_p0[14], ufi_wdqx_p0[119:112], ufi_wcbx_p0[14]} |
| ufi_sdin1_en | C→P | ufi_rdqx_en | ufi_rdqx_en | ufi_rdqx_en | ufi_rdqx_en | ufi_rdqx_en |
| ufi_sdin1_rden | C→P | ufi_rdqx_rden | ufi_rdqx_rden | ufi_rdqx_rden | ufi_rdqx_rden | ufi_rdqx_rden |
| ufi_sdin1[39:0] | P→C | {ufi_sdin1_nc[39], ufi_rdqx_p1[31], ufi_rdbix_p1[3], ufi_rdqx_p1[29], ufi_rdqx_p1[30], ufi_rdqx_p1[27:24], ufi_rcbx_p1[3], ufi_rdbix_p1[2], ufi_rdqx_p1[23:16], ufi_rcbx_p1[2], ufi_sdin1_nc[19], ufi_rdqx_p0[31], ufi_rdbix_p0[3], ufi_rdqx_p0[29], ufi_rdqx_p0[30], ufi_rdqx_p0[27:24], ufi_rcbx_p0[3], ufi_rdbix_p0[2], ufi_rdqx_p0[23:16], ufi_rcbx_p0[2]} | {ufi_rdbix_p1[3], ufi_rdqx_p1[31:24], ufi_rcbx_p1[3], ufi_rdbix_p1[2], ufi_rdqx_p1[23:16], ufi_rcbx_p1[2], ufi_rdbix_p0[3], ufi_rdqx_p0[31:24], ufi_rcbx_p0[3], ufi_rdbix_p0[2], ufi_rdqx_p0[23:16], ufi_rcbx_p0[2]} | {ufi_rdbix_p1[7], ufi_rdqx_p1[63:56], ufi_rcbx_p1[7], ufi_rdbix_p1[6], ufi_rdqx_p1[55:48], ufi_rcbx_p1[6], ufi_rdbix_p0[7], ufi_rdqx_p0[63:56], ufi_rcbx_p0[7], ufi_rdbix_p0[6], ufi_rdqx_p0[55:48], ufi_rcbx_p0[6]} | {ufi_rdbix_p1[11], ufi_rdqx_p1[95:88], ufi_rcbx_p1[11], ufi_rdbix_p1[10], ufi_rdqx_p1[87:80], ufi_rcbx_p1[10], ufi_rdbix_p0[11], ufi_rdqx_p0[95:88], ufi_rcbx_p0[11], ufi_rdbix_p0[10], ufi_rdqx_p0[87:80], ufi_rcbx_p0[10]} | {ufi_rdbix_p1[15], ufi_rdqx_p1[127:120], ufi_rcbx_p1[15], ufi_rdbix_p1[14], ufi_rdqx_p1[119:112], ufi_rcbx_p1[14], ufi_rdbix_p0[15], ufi_rdqx_p0[127:120], ufi_rcbx_p0[15], ufi_rdbix_p0[14], ufi_rdqx_p0[119:112], ufi_rcbx_p0[14]} |

Figure 17A:
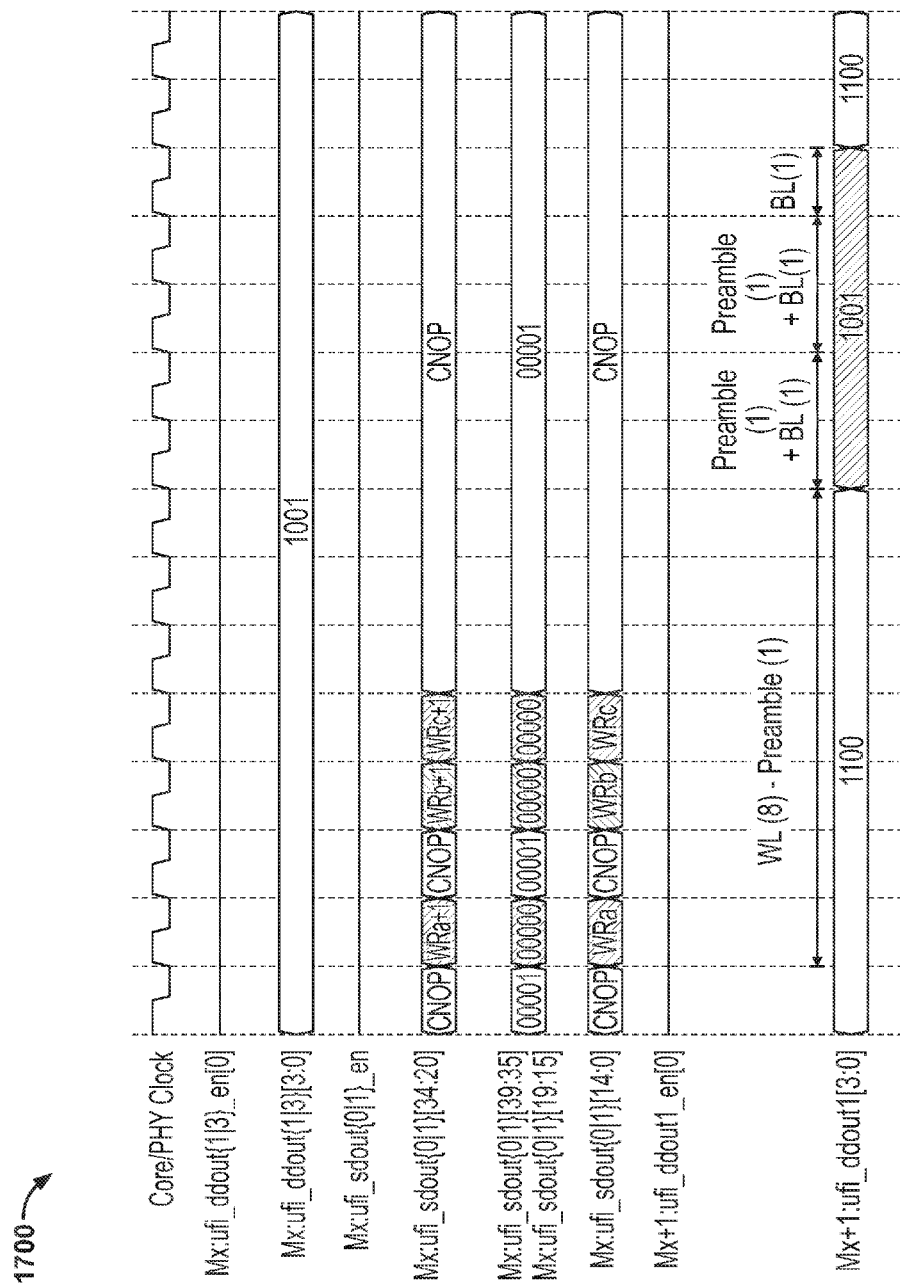
FIGS. 17A and 17B (hereinafter collectively referred to as FIG. 17) depict an illustrative timing diagram of an interface block working together with a QDR WIO SRAM according to certain embodiments.
Figure 17B:
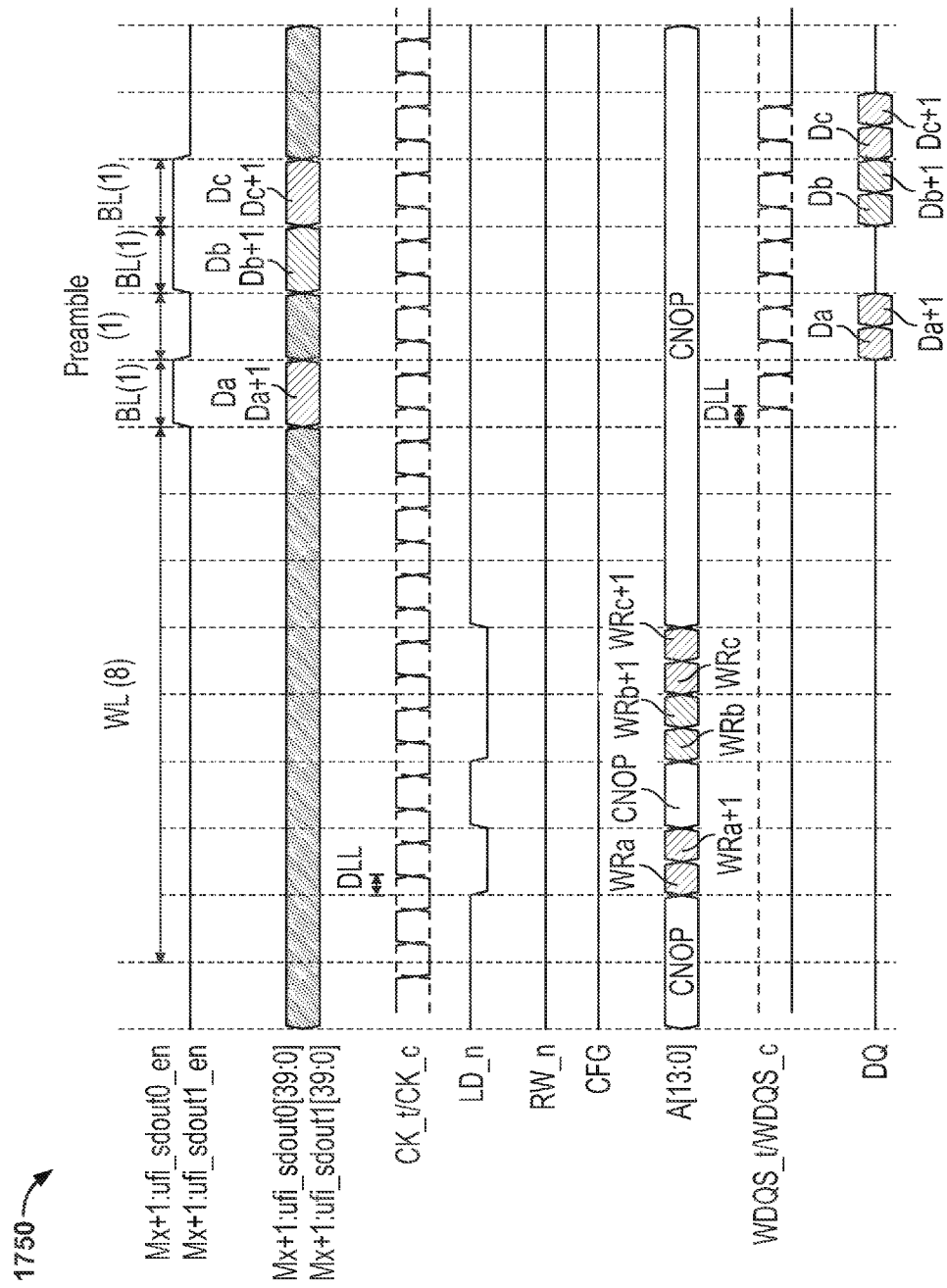
Figure 18A:
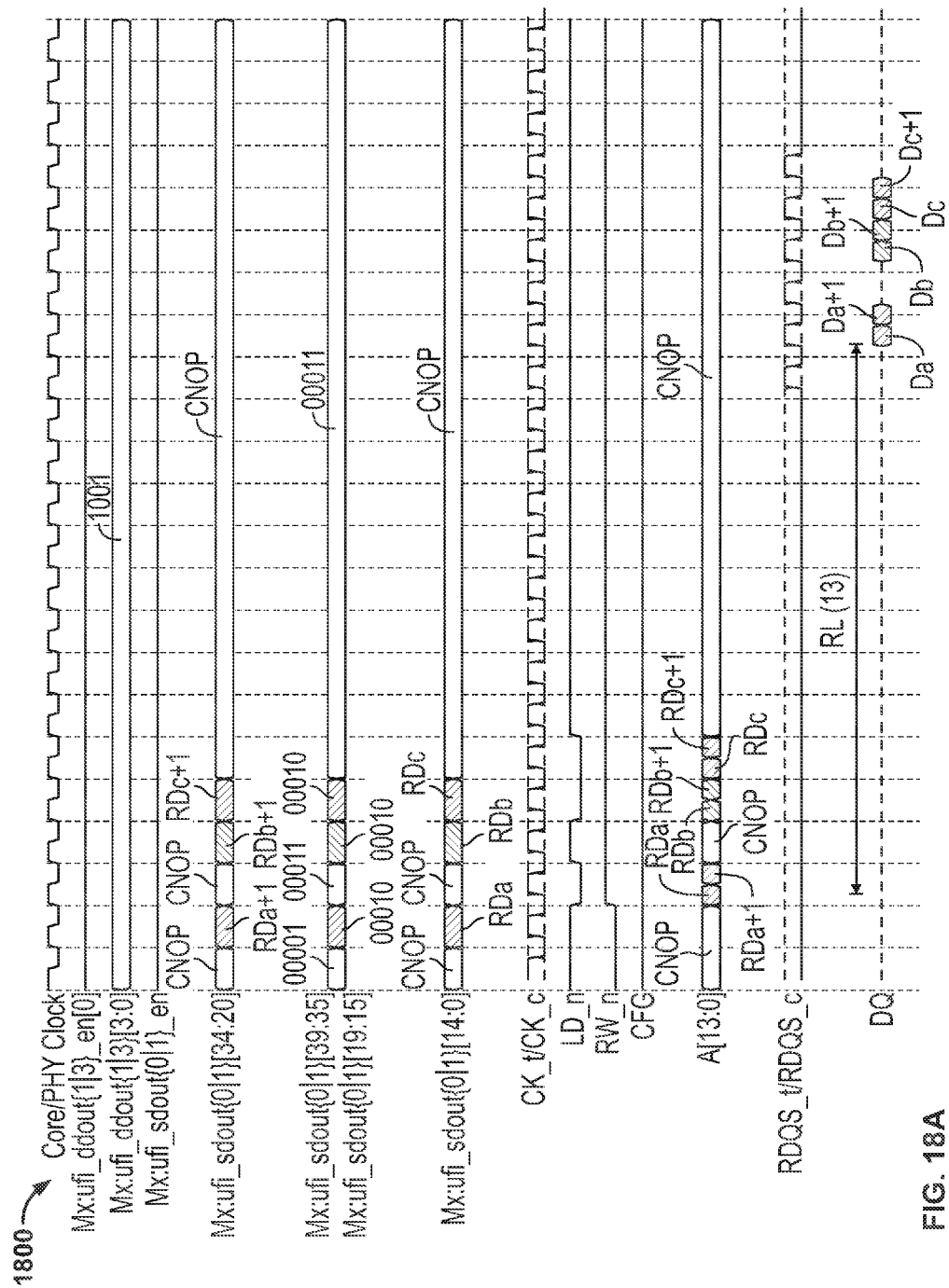
FIGS. 18A and 18B (hereinafter collectively referred to as FIG. 18) depict another illustrative timing diagram of an interface block working together with a QDR WIO SRAM according to certain embodiments.
Figure 18B:
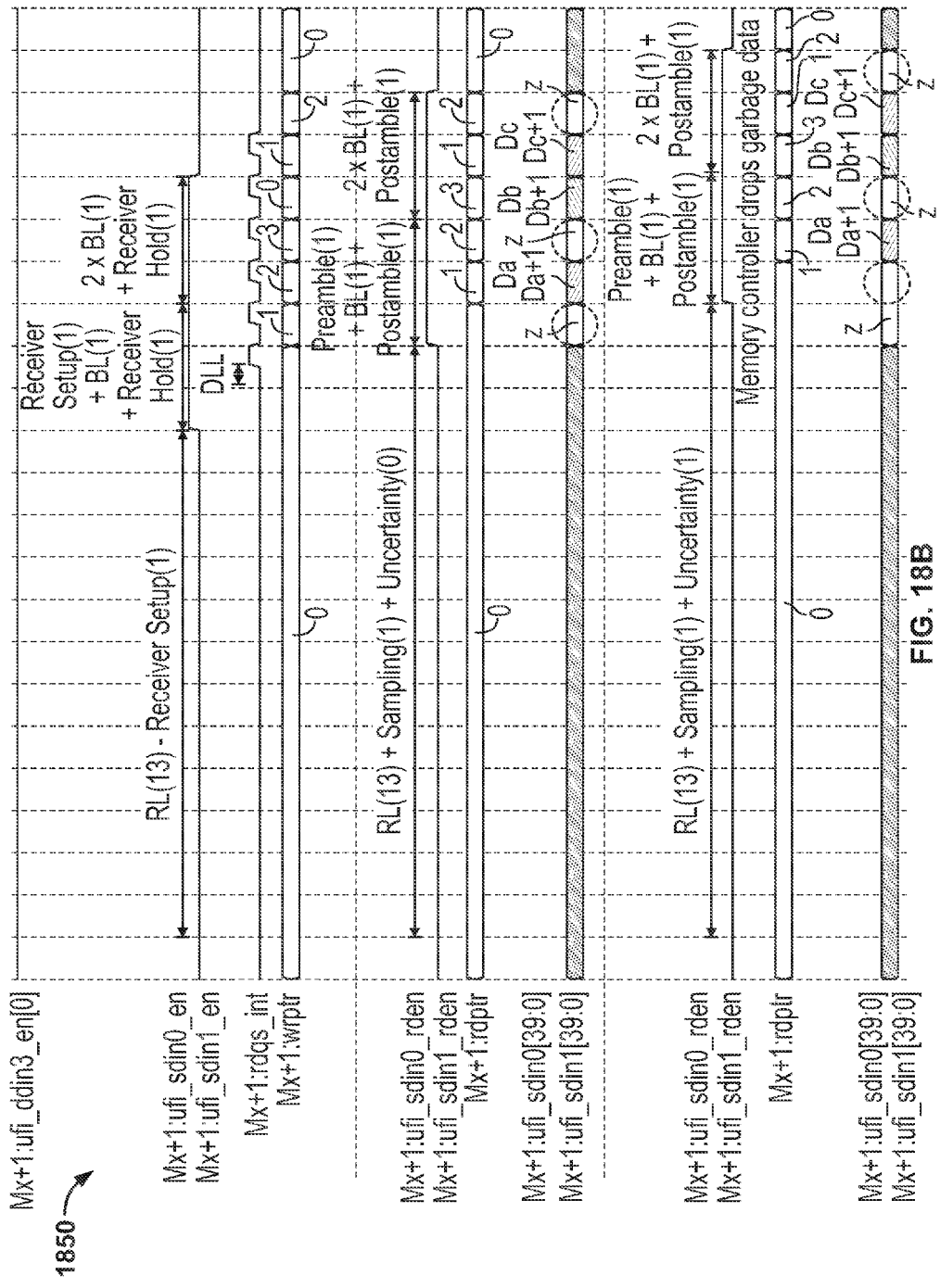
Figure 19A:
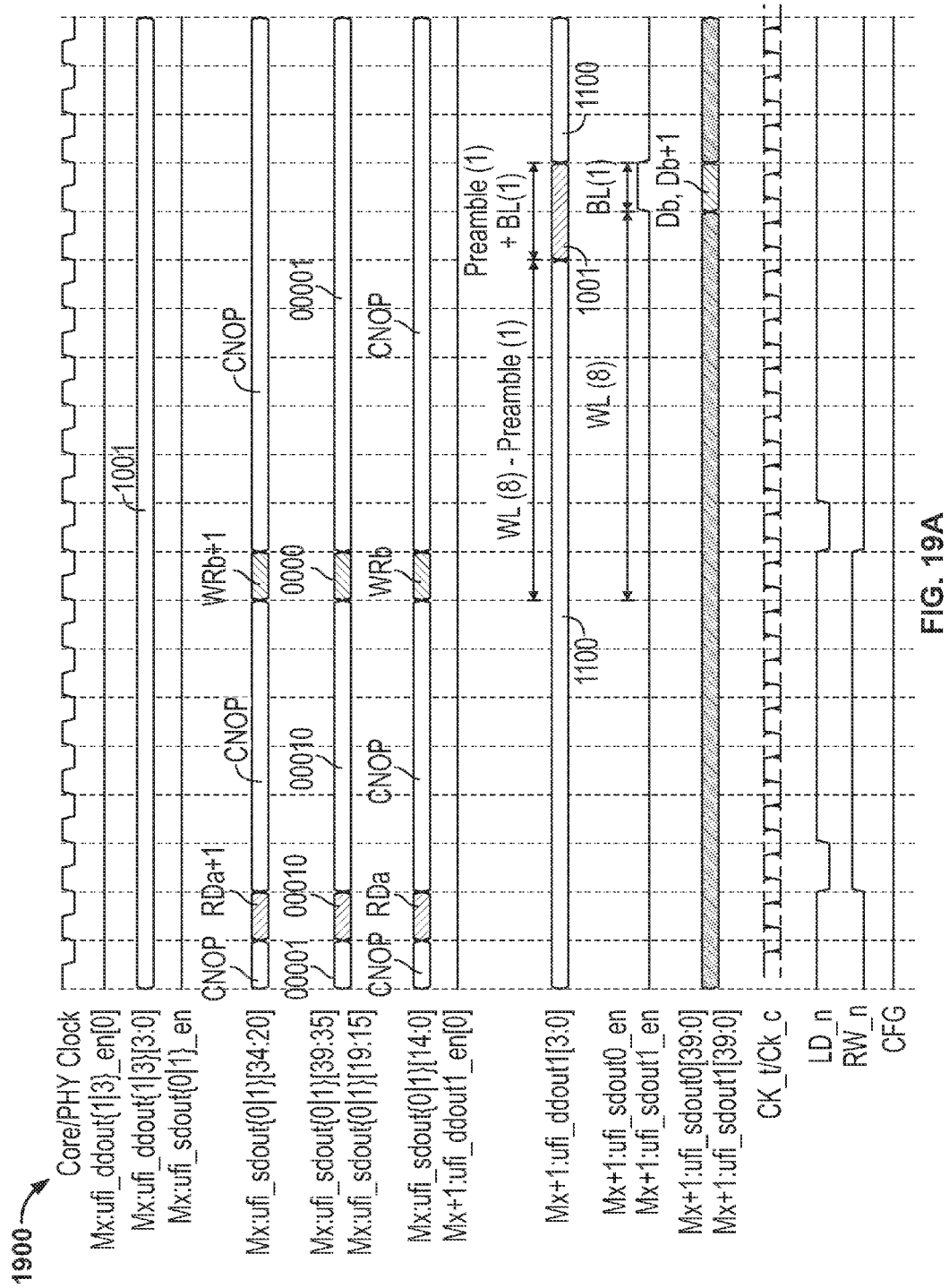
FIGS. 19A and 19B (hereinafter collectively referred to as FIG. 19) depict yet another illustrative timing diagram of an interface block working together with a QDR WIO SRAM according to certain embodiments.
Figure 19B:
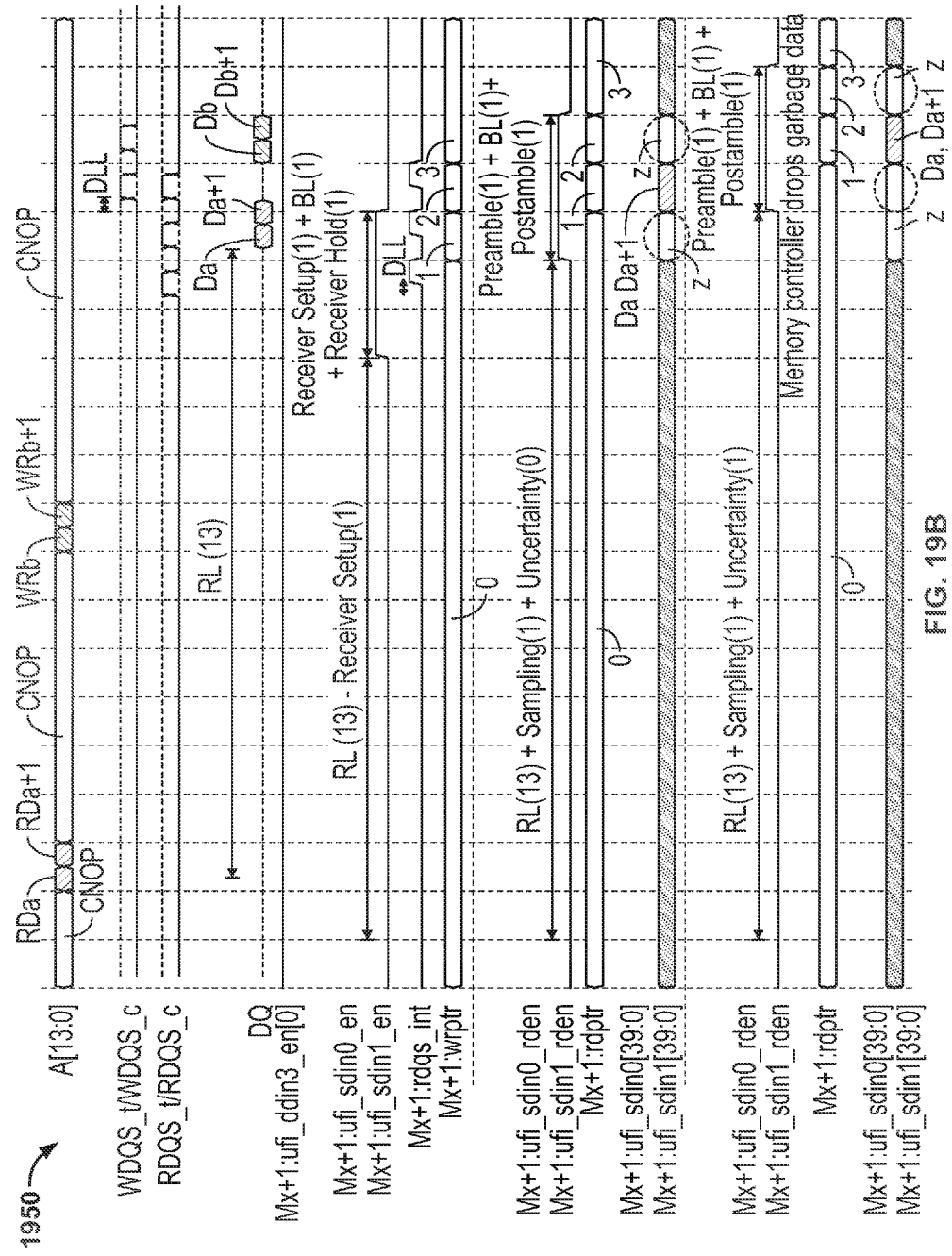
Figure 20A:
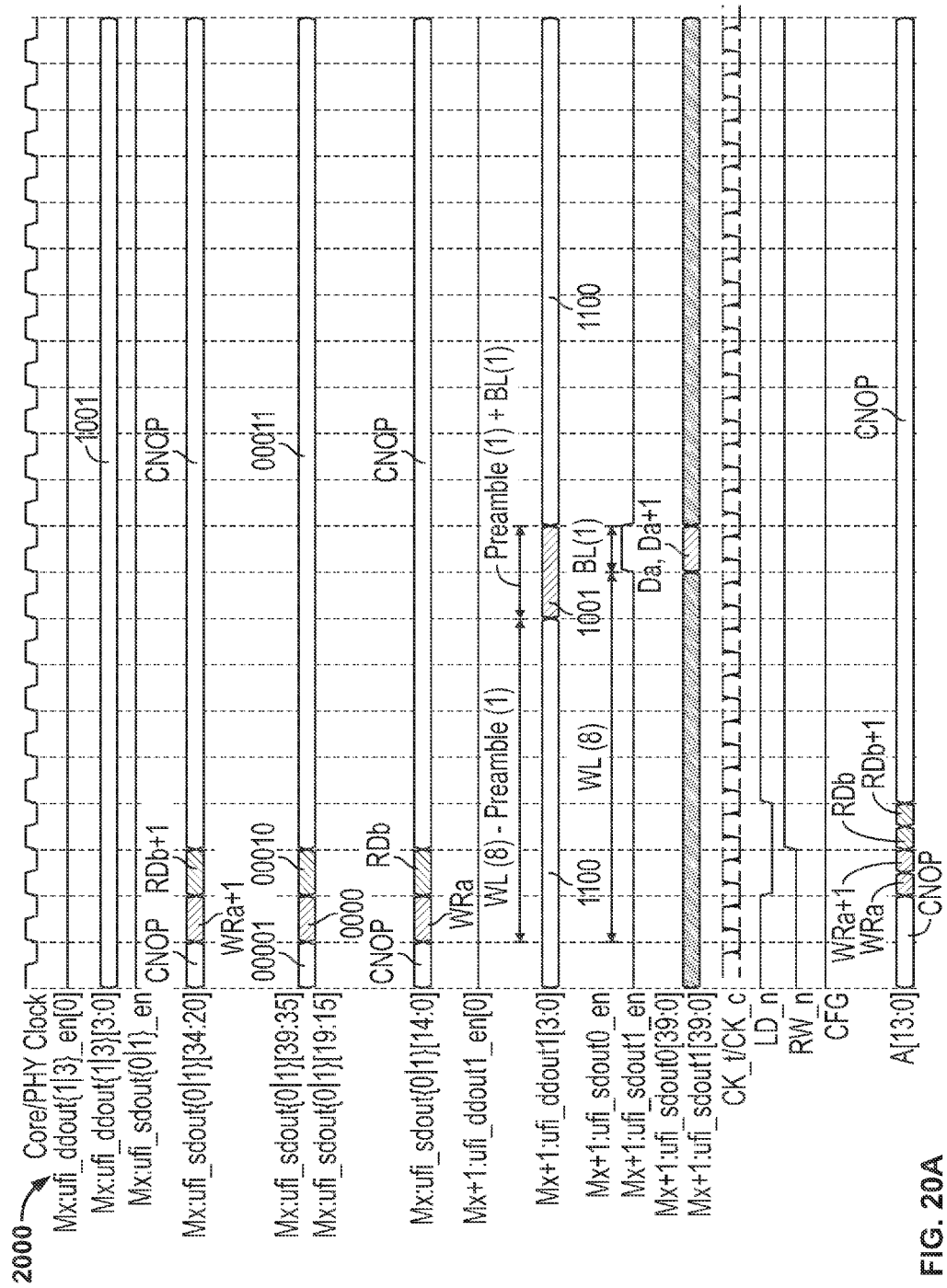
FIGS. 20A and 20B (hereinafter collectively referred to as FIG. 20) depict yet another illustrative timing diagram of an interface block working together with a QDR WIO SRAM according to certain embodiments.
Figure 20B:
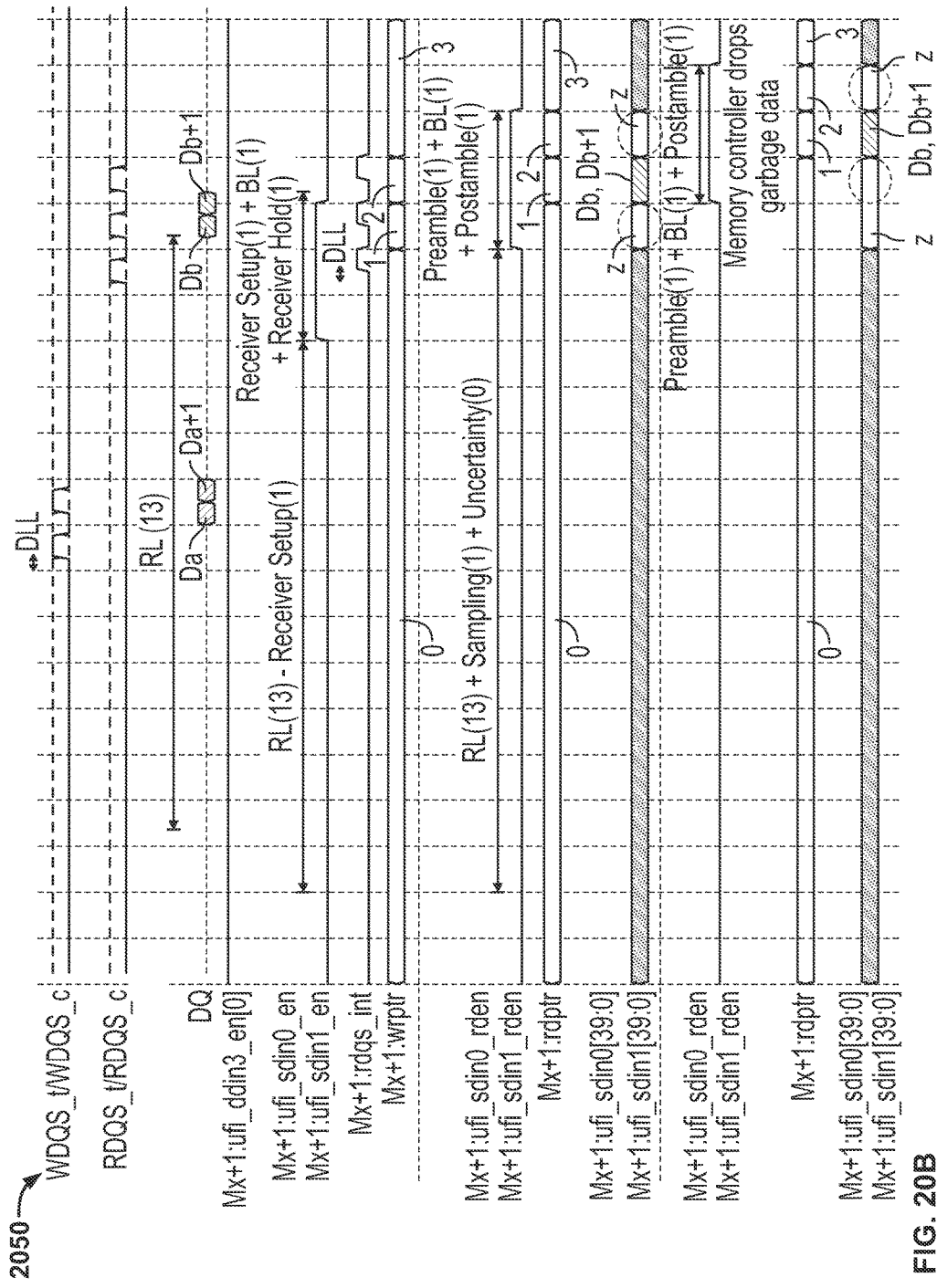

FIGS. 17-20 are illustrative timing diagrams of an interface block working together with a QDR WIO SRAM according to certain embodiments. FIG. 17 shows a memory write timing diagram 1700 of an interface block working together with a QDR WIO SRAM (for write latency, WL=8). FIG. 18 shows a memory read timing diagram 1800 of an interface block working together with a QDR WIO SRAM (for read latency, RL=13). FIG. 19 shows a timing diagram 1900 of an interface block working together with a QDR WIO SRAM where a memory read (for read latency, RL=13) is followed by a memory write (for write latency, WL=8). FIG. 20 shows a timing diagram 2000 of an interface block working together with a QDR WIO SRAM where a memory write (for write latency, WL=8) is followed by a memory read (for read latency, RL=13).

It will be understood that the foregoing uses of the terms "programmable logic" and "FPGA" are exemplary, and such use may be applicable to programmable logic devices and other suitable circuits, including but not limited to commercial FPGAs, configurable ASSP devices, configurable DSP and GPU devices, hybrid ASIC/programmable devices, devices which are described as ASICs with programmable logic cores, or programmable logic devices with embedded ASIC or ASSP cores.

It will be understood that the foregoing is only illustrative of the principles of the invention, and that various modifications may be made by those skilled in the art without departing from the scope and spirit of the invention, and the present invention is limited only by the claims that follow. For example, the various inventive aspects that have been discussed herein can either all be used together in certain embodiments, or other embodiments may employ only one or more (but less than all) of the inventive aspects. And if multiple (but less than all) of the inventive aspects are employed, that can involve employment of any combination of the inventive aspects. As another example of possible modifications, throughout this disclosure, particular parameter values are mentioned. These particular values are only examples, and other suitable parameter values can be used instead if desired.

What is claimed is:

1. An interface block comprising:
a plurality of input/output modules distributed along the interface block; and
a mid-stack module interspersed within the plurality of input/output modules, the mid-stack module in communication with the plurality of input/output modules via programmable logic circuitry,
wherein:
the plurality of input/output modules comprises at least one data module and at least one command module,
at least one of the plurality of input/output modules is shared by an adjacent pair of channels,
each of the plurality of input/output modules is configured to interface with a memory device via at least one of a silicon interposer and a silicon bridge,
each of the input/output modules comprises a first plurality of pins mapped to one of a plurality of programmable single-ended input/output (PSIO) sub-modules, and a second plurality of pins mapped to one of a plurality of programmable differential/single-ended input/output (PDIO) sub-modules, and
a clock topology is partitioned such that a first set of clocks are redistributable from a first half of the PSIO sub-modules to a second half of the PSIO sub-modules.

2. The interface block of claim 1, wherein the at least one of the plurality of input/output modules shared by the adjacent pair of channels is partitioned into two sub-modules with the same number of pins.

3. The interface block of claim 1, wherein the at least one data module comprises a first subset of PDIO sub-modules mapped to output strobe pins and a second subset of PDIO sub-modules mapped to input strobe pins.

4. The interface block of claim 3, wherein the at least one data module further comprises a first loop circuit mapped to the first subset of PDIO sub-modules and a second loop circuit mapped to the second subset of PDIO sub-modules, wherein the first loop circuit is configured to delay an output strobe unit mapped to a PSIO sub-module.

5. The interface block of claim 4, wherein the first loop circuit and the second loop circuit are at least one of a delay-locked loop (DLL) circuit and a phase-locked loop (PLL) circuit.

6. The interface block of claim 1, wherein the at least one command module comprises a differential clock output mapped to a PDIO sub-module.

7. The interface block of claim 1, wherein the mid-stack comprises independent clock quadrants, wherein each clock quadrant is configured to operate at different phases, wherein each phase is aligned to a respective core clock or each respective core clock is aligned to a physical layer clock.

8. The interface block of claim 1, wherein each of the plurality of input/output modules are 48-IO modules.

9. An interface block comprising:
a plurality of input/output modules distributed along the interface block, wherein the plurality of input/output modules comprises at least one data module and at least one command module, wherein at least one of the plurality of input/output modules is shared by an adjacent pair of channels, and wherein each of the plurality of input/output modules is configured to interface with a memory device via at least one of a silicon interposer and a silicon bridge, wherein the at least one data module comprises a first subset of PDIO sub-modules mapped to output strobe pins and a second subset of PDIO sub-modules mapped to input strobe pins, and wherein the at least one data module comprises a first loop circuit mapped to the first subset of PDIO sub-modules and a second loop circuit mapped to the second subset of PDIO sub-modules, wherein the first loop circuit is configured to delay an output strobe unit mapped to a PSIO group.

10. The interface block of claim 9, wherein each of the input/output modules comprises a first plurality of pins mapped to one of a plurality of programmable single-ended input/output (PSIO) sub-modules, and a second plurality of pins mapped to one of a plurality of programmable differential/single-ended input/output (PDIO) sub-modules.

11. The interface block of claim 10, wherein a clock topology is partitioned such that a first set of clocks are redistributable from a first half of the PSIO sub-modules to a second half of the PSIO sub-modules.

12. The interface block of claim 9, wherein the at least one data module comprises a first loop circuit mapped to the first subset of PDIO sub-modules and a second loop circuit mapped to the second subset of PDIO sub-modules, wherein the first loop circuit is configured to delay an output strobe unit mapped to a PSIO group.

13. The interface block of claim 12, wherein the first loop circuit and the second loop circuit are one of a delay-locked loop (DLL) circuit and a phase-locked loop (PLL) circuit.

14. The interface block of claim 9, wherein the at least one command module comprises a differential clock output mapped to a PSIO group.

15. The interface block of claim 9, wherein each of the plurality of input/output modules are 48-IO modules.

16. An interface block comprising:
   a plurality of input/output modules distributed along the interface block; and
   a mid-stack module interspersed within the plurality of input/output modules, the mid-stack module in communication with the plurality of input/output modules via programmable logic circuitry, wherein the mid-stack module comprises independent clock quadrants, wherein each clock quadrant is configured to operate at different phases, and wherein each phase is aligned to a respective core clock, wherein the plurality of input/ output module comprises a data module comprising a first subset of PDIO sub-modules mapped to output strobe pins and a second subset of PDIO sub-modules mapped to input strobe pins, and the data module comprises a first loop circuit mapped to the first subset of PDIO sub-modules and a second loop circuit mapped to the second subset of PDIO sub-modules, wherein the first loop circuit is configured to delay an output strobe unit mapped to a PSIO sub-module.

17. The interface block of claim 16, wherein each input/ output module communicates with the programmable logic circuity via a universal interface protocol including one or more of a control interface group and a data interface group, wherein:
   the control interface group transmits at least one of an address, a command, and a control signal to the programmable logic circuitry, and
   the data interface group transmits to and receives data from the programmable logic circuitry.

* * * * *